United States Patent
Shafiullah et al.

(10) Patent No.: US 11,349,306 B2
(45) Date of Patent: May 31, 2022

(54) DISTRIBUTION GRID FAULT ANALYSIS UNDER LOAD AND RENEWABLE ENERGY UNCERTAINTIES

(71) Applicant: King Fahd University of Petroleum and Minerals, Dhahran (SA)

(72) Inventors: Md Shafiullah, Dhahran (SA); M. A. Abido, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 388 days.

(21) Appl. No.: 16/445,972

(22) Filed: Jun. 19, 2019

(65) Prior Publication Data

US 2020/0403406 A1  Dec. 24, 2020

(51) Int. Cl.
| | | |
|---|---|---|
| *G06G 7/54* | (2006.01) | |
| *H02J 3/00* | (2006.01) | |
| *H02J 3/38* | (2006.01) | |
| *G06N 3/04* | (2006.01) | |
| *H02J 3/46* | (2006.01) | |
| *G06N 7/00* | (2006.01) | |

(Continued)

(52) U.S. Cl.
CPC .......... *H02J 3/0073* (2020.01); *G01R 31/088* (2013.01); *G06F 17/14* (2013.01); *G06N 3/04* (2013.01); *G06N 7/005* (2013.01); *H02J 3/386* (2013.01); *H02J 3/46* (2013.01); *H02J 3/003* (2020.01)

(58) Field of Classification Search
CPC .. H02J 3/0073; H02J 3/386; H02J 3/46; H02J 3/003; H02J 13/00002; H02J 2300/40; H02J 3/004; H02J 2203/20; H02J 3/0012; G06N 3/04; G06N 7/005; G06N 3/0481; G06N 3/084; G06F 17/14; G01R 31/088; Y02E 40/70; Y02E 60/00; Y02E 10/76; Y04S 40/20; Y04S 10/30; Y04S 10/22; Y04S 10/52; Y04S 10/50
USPC ......................................................... 703/18
See application file for complete search history.

(56) References Cited

U.S. PATENT DOCUMENTS

| | | | |
|---|---|---|---|
| 8,706,311 B2 | 4/2014 | Kosaka et al. | |
| 2015/0027841 A1 | 10/2015 | Kumar et al. | |

FOREIGN PATENT DOCUMENTS

| | | |
|---|---|---|
| CN | 105759165 B | 11/2018 |
| CN | 106026092 B | 12/2018 |
| CN | 109066688 A | 12/2018 |

OTHER PUBLICATIONS

Abido, et al. ; Fault Diagnosis in Distribution Grids Under Load and Renewable Energy Uncertainties ; College of Engineering Sciences Thesis (PhD) ; Sep. 20, 2018 ; 2 Pages.

(Continued)

*Primary Examiner* — Richard Tan
(74) *Attorney, Agent, or Firm* — Oblon, McClelland, Maier & Neustadt, L.L.P.

(57) ABSTRACT

A versatile intelligent fault diagnosis (IFD) method for a distribution grid integrating renewable energy resources is described. Advanced signal processing techniques extract useful features from recorded three-phase current signals, which are input to a multilayer perceptron neural networks (MLP-NN) to diagnose i.e., to detect, classify, identify the feeder branch, and locate the faults. Once a fault is detected, classified and located, a grid operator may adjust grid parameters or dispatch a technician to correct the fault. The IFD method is independent of load demand, renewable energy generation, and fault information (resistance and inception angle) uncertainties, as well as measurement noise.

20 Claims, 12 Drawing Sheets

(51) Int. Cl.
    *G06F 17/14*    (2006.01)
    *G01R 31/08*    (2020.01)

(56) References Cited

OTHER PUBLICATIONS

Matlab & Simulink ; IEEE 13 Node Test Feeder; https://www.mathwork.com/help/physmod/sps/examples.ieee-13-node-test-feeder.html ; Product ; Apr. 30, 2019 ; 1 Page.
Kersting ; Radial Distribution Test Feeders ; Distribution Systems Analysis Subcommittee ; 2000 ; 5 Pages.
National Instruments ; Phasor Measurement (Stf 2011 )VI ; Product; Mar. 2017 ; 3 Pages.
RTDS Technologies Inc. ; Real Time Power System Simulation ; Apr. 30, 2019 ; https://www.rtds.com/real-time-power-system-simulation/ ; 6 Pages.
RTDS Technologies Inc. ; GTIO Cards ; 2 Pages.
RTDS Technologies, Inc. ; RSCAD—Power System Simulation Software ; Apr. 30, 2019 ; htttps://www.rtds.com/the-simulator/our-software-about-rscad/; 2 Pages.
U.S. Department of Energy ; A reference Model for Distribution Grid Control in the $21^{st}$ Century ; Jul. 2015 ; 34 Pages.
Safiullah, et al. ; Distribution Grid Fault Diagnosis under Load and Renewable Energy Uncertainties ; 8 Pages.
Safiullah ; Fault Diagnosis in Distribution Grids Under Load and Renewable Energy Uncertainties ; Apr. 2018 ; 277 Pages.

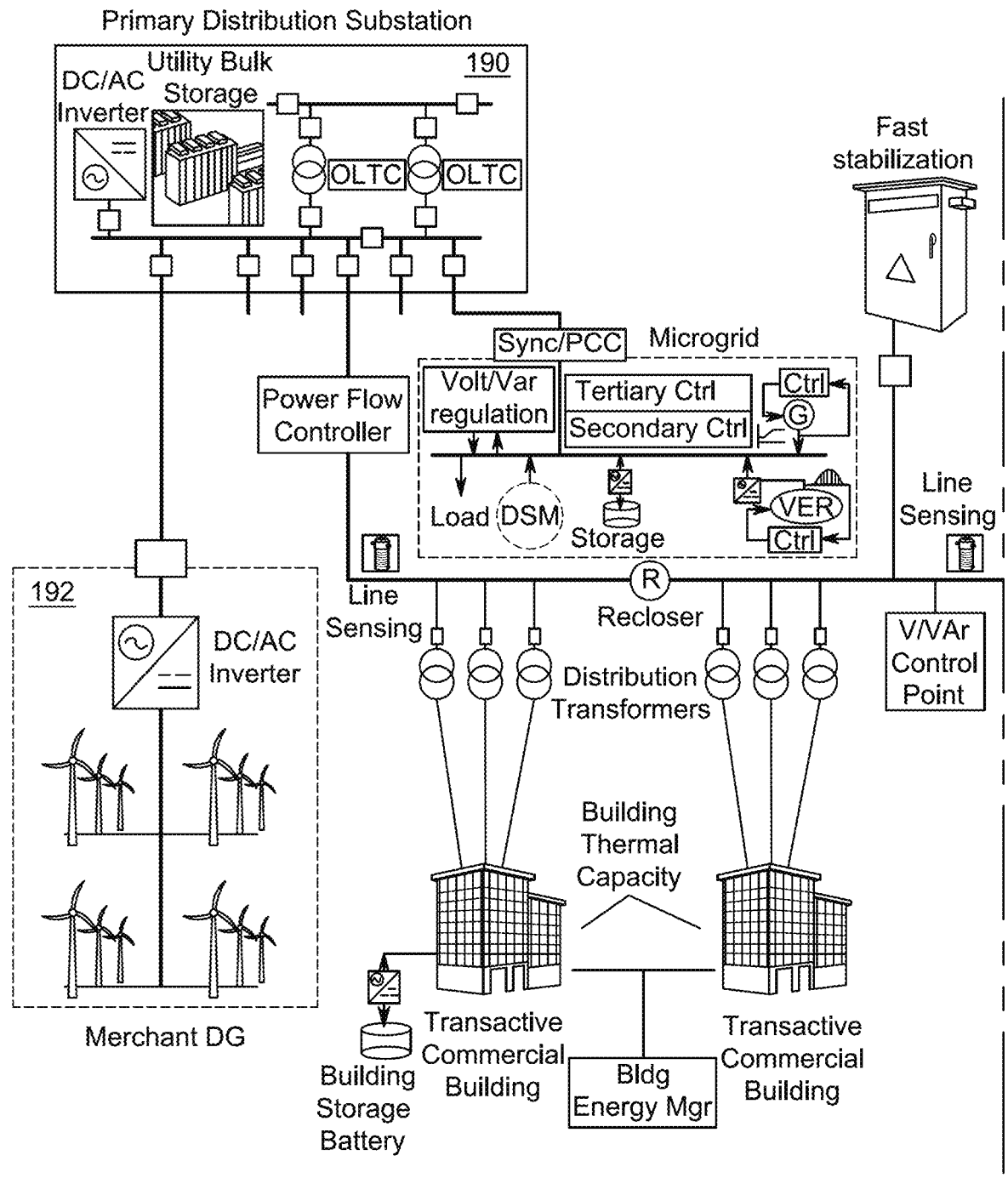
FIG. 1 (Partial View)
PRIOR ART

DISTRIBUTION GRID FAULT ANALYSIS UNDER LOAD AND RENEWABLE ENERGY UNCERTAINTIES

STATEMENT OF ACKNOWLEDGEMENT

The support provided by King Fand University of Petroleum & Minerals (KFUPM), under Project 14-ENE265-04 and King Abdulaziz City for Science and Technology (KACST) through the Science and Technology Unit (STU), as a part of the National Science, Technology and Innovation Plan (NSTIP) is gratefully acknowledged.

BACKGROUND

Technical Field

The present disclosure is directed to intelligent fault diagnosis of a distribution feeder connected to renewable energy resources.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Electricity customers are connected to electricity distribution grids through distribution feeders; any interruption to a distribution grid causes customer minute loss (CML). The majority of CML occurs due to longer lasting faults. The precise fault information, i.e., faulty area and location, plays an important role in expediting the restoration process of electricity grids by reducing the outage duration after being subjected to a fault.

Distribution grid fault location methods can be classified into three major groups: impedance-based, traveling wave-based and knowledge-based methods. (See A. Farughian, L. Kumpulainen, and K. Kauhaniemi, "Review of methodologies for earth fault indication and location in compensated and unearthed MV distribution networks," *Electr. Power Syst. Res.*, Vol. 154, pp. 373-380, January 2018; S. S. Gururajapathy, H. Mokhlis, and H. A. Illias, "Fault location and detection techniques in power distribution systems with distributed generation: A review," *Renew. Sustain. Energy Rev.*, Vol. 74, pp. 949-958, July 2017; and M. Shafiullah and M. A. Abido, "A Review on Distribution Grid Fault Location Techniques," *Electr. Power Components Syst.*, Vol. 45, No. 8, pp. 807-824, May 2017, each incorporated herein by reference in their entirety). These impedance-based fault location methods are the simplest and most economical, hence, often used by the electric power utilities. Calculated impedance values based on the recorded voltage and current signals from the measurement node to locate faults are used. (See L. Rui, P. Nan, Y. Zhi, and F. Zare, "A novel single-phase-to-earth fault location method for distribution network based on zero-sequence components distribution characteristics," *Int. J. Electr. Power Energy Syst.*, Vol. 102, pp. 11-22, November 2018; S. Das, N. Karnik, and S. Santoso, "Distribution Fault-Locating Algorithms Using Current Only," *IEEE Trans. Power Deliv.*, Vol. 27, No. 3, pp. 1144-1153, July 2012; and R. Dashti, M. Ghasemi, and M. Daisy, "Fault location in power distribution network with presence of distributed generation resources using impedance based method and applying line model," *Energy*, Vol. 159, pp. 344-360, September 2018, each incorporated herein by reference in their entirety). However, these approaches are based on rapid iterative processes which may generate multiple estimations due to the presence of laterals. Additionally, load demand and fault information uncertainties, presence of measurement noise, and other inherent properties of distribution grids, significantly impair measurement accuracy.

Conversely, travelling wave-based techniques are relatively faster than impedance-based techniques and use the characteristic frequencies of the traveling waves. (See A. Bahmanyar, S. Jamali, A. Estebsari, and E. Bompard, "A comparison framework for distribution system outage and fault location methods," *Electr. Power Syst. Res.*, Vol. 145, pp. 19-34, April 2017, incorporated herein by reference in its entirety). Though these techniques can effectively locate faults in longer transmission lines, inherent properties of the distribution grids, i.e., the presence of laterals and load taps, severely affect their accuracy. Furthermore, implementation costs for travelling wave-based techniques are higher than other techniques as they require advanced measurement infrastructure and communication systems. (See R. Dutta and S. R. Samantaray, "Assessment of impedance based fault locator for AC micro-grid," *Renew. Energy Focus*, Vol. 26, pp. 1-10, September 2018, incorporated herein by reference in its entirety).

In the third category, knowledge-based fault location techniques are based on machine learning tools, and offer promising solutions in diagnosing distribution grid faults considering their intrinsic complexities. (See M. Shafiullah, M. Abido, T. Abdel-Fattah, M. Shafiullah, M. A. Abido, and T. Abdel-Fattah, "Distribution Grids Fault Location employing ST based Optimized Machine Learning Approach," *Energies*, Vol. 11, No. 9, p. 2328, September 2018, incorporated herein by reference in its entirety).

A data mining approach to locate faults in distribution feeder to reduce the errors related to multiple estimations of faulty branches was proposed. (See E. A. Reche, J. V. de Sousa, D. V. Coury, and R. A. S. Fernandes, "Data Mining-Based Method to Reduce Multiple Estimation for Fault Location in Radial Distribution Systems," *IEEE Trans. Smart Grid*, pp. 1-1, 2018, incorporated herein by reference in its entirety). However, the effect of measurement noise on the accuracy of knowledge-based fault location techniques was not investigated.

Fault location techniques for distribution grids have been used which combine the wavelet transform (WT) with other machine learning tools. (See M. Shafiullah, M. A. Abido, and Z. Al-Hamouz, "Wavelet-based extreme learning machine for distribution grid fault location," *IET Gener. Transm. Distrib.*, Vol. 11, No. 17, pp. 4256-4263, November 2017; I. M. Karmacharya and R. Gokaraju, "Fault Location in Ungrounded Photovoltaic System Using Wavelets and ANN," *IEEE Trans. Power Deliv.*, Vol. 33, No. 2, pp. 549-559, April 2018; M. Pourahmadi-Nakhli and A. A. Safavi, "Path Characteristic Frequency-Based Fault Locating in Radial Distribution Systems Using Wavelets and Neural Networks," *IEEE Trans. Power Deliv.*, Vol. 26, No. 2, pp. 772-781, April 2011; and M. Shafiullah, M. Ijaz, M. A. Abido, and Z. Al-Hamouz, "Optimized support vector machine & wavelet transform for distribution grid fault location," *2017 11th IEEE International Conference on Compatibility, Power Electronics and Power Engineering (CPE-POWERENG)*. IEEE, pp. 77-82, 2017, each incorporated herein by reference in their entirety). However, the WT based decompositions, do not uphold the phase information of the original signal and are sensitive to the presence of measurement noise.

A signal processing technique, the Stockwell Transform (ST), combined the advantages of the short term Fourier transform and WT to uphold the phase information and referenced frequency. (See R. G. Stockwell, L. Mansinha, and R. P. Lowe, "Localization of the complex spectrum: The S transform," *IEEE Trans. Signal Process.*, Vol. 44, No. 4, pp. 998-1001, 1996; L. Mansinha, R. G. Stockwell, and R. P. Lowe, "Pattern analysis with two-dimensional spectral localisation: Applications of two-dimensional S transforms," *Phys. A Stat. Mech. its Appl.*, Vol. 239, No. 1-3, pp. 286-295, May 1997; Y. Wang, "Efficient Stockwell transform with applications to image processing," University of Waterloo, 2011, each incorporated herein by reference in their entirety). The Stockwell transform was successfully employed to detect and classify faults in distribution grids. (See M. Shafiullah and M. A. Abido, "S-Transform Based FFNN Approach for Distribution Grids Fault Detection and Classification," *IEEE Access*, Vol. 6, pp. 8080-8088, 2018, incorporated herein by reference in its entirety).

However, most of the above described fault diagnosis techniques do not integrate renewable energy resources, uncertainties associated with load demand, renewable energy generation, fault information, and/or the presence of measurement noise with their techniques.

Energy-related emission is the largest single source of global greenhouse gas emissions and environmental pollution. In addition to the serious environmental pollution problem, the shortage of conventional energy resources and rising energy costs have compelled many countries to explore alternative energy resources to reduce their dependencies on conventional energy resources and to ensure sustainable social and economic development. (See Y. Zhang, W. Chen, and W. Gao, "A survey on the development status and challenges of smart grids in main driver countries," *Renew. Sustain. Energy Rev.*, incorporated herein by reference in its entirety).

Two important elements are needed, i.e. an improvement in energy efficiency and augmentation of the shares of renewable energy in the energy generation mix to accelerate the de-carbonization move and to produce secure energy. Consequently, the incorporation of renewable energy resources throughout the electricity grids has increased significantly, especially to the power distribution grids. These renewable energy resources improve bus voltage profile, supply reactive power, and enhance grid load-ability, security, reliability, and power quality. However, compared to conventional energy sources, many renewable energy sources exhibit randomness and intermittency as the outputs of such resources include solar and wind power plants, which are highly dependent on climatic conditions. (See M. B. Jannat and A. S. Savić, "Optimal capacitor placement in distribution networks regarding uncertainty in active power load and distributed generation units production," *IET Gener. Transm. Distrib.*, Vol. 10, No. 12, pp. 3060-3067, September 2016, incorporated herein by reference in its entirety).

Consequently, power system operators face uncertainties from both renewable energy generation and load demand sides. These uncertainties need to be managed to provide quality and a reliable power supply to the customers.

Stochastic behavior of wind speed has been a subject of research, and employs approaches including the Weibull probability density function (PDF), Rayleigh PDF, time series analysis, and artificial intelligence. (See Z. Liu, F. Wen, and G. Ledwich, "Optimal Siting and Sizing of Distributed Generators in Distribution Systems Considering Uncertainties," *IEEE Trans. Power Deliv.*, Vol. 26, No. 4, pp. 2541-2551, October 2011; Y. M. Atwa, E. F. El-Saadany, M. M. A. Salama, and R. Seethapathy, "Optimal Renewable Resources Mix for Distribution System Energy Loss Minimization," *IEEE Trans. Power Syst.*, Vol. 25, No. 1, pp. 360-370, February 2010; S. Mojtahedzadeh, S. N. Ravadanegh, and M.-R. Haghifam, "Optimal multiple microgrids based forming of greenfield distribution network under uncertainty," *IET Renew. Power Gener.*, Vol. 11, No. 7, pp. 1059-1068, June 2017; A. Zakariazadeh, S. Jadid, and P. Siano, "Smart microgrid energy and reserve scheduling with demand response using stochastic optimization," *Int. J. Electr. Power Energy Syst.*, Vol. 63, pp. 523-533, December 2014; P. Siano and G. Mokryani, "Evaluating the Benefits of Optimal Allocation of Wind Turbines for Distribution Network Operators," *IEEE Syst. J.*, Vol. 9, No. 2, pp. 629-638, June 2015, each incorporated herein by reference in their entirety).

Further, power output of a wind turbine has been derived from wind speed power curves. (See S. Zolfaghari, G. H. Riahy, and M. Abedi, "A new method to adequate assessment of wind farms' power output," *Energy Convers. Manag.*, Vol. 103, pp. 585-604, October 2015, incorporated herein by reference in its entirety).

Similarly, the stochastic behavior of solar irradiation has been modeled using the beta PDF, Weibull PDF, and artificial intelligence. (See Jannat et al.; Atwa et al.; Mojtahedzadeh et al.; Zakariazadeh et al.; and S. Zolfaghari, G. H. Riahy, and M. Abedi, "A new method to adequate assessment of wind farms' power output," *Energy Convers. Manag.*, Vol. 103, pp. 585-604, October 2015, each incorporated herein by reference in their entirety).

The stochastic behavior of the load demand of distribution grids has been modeled using the normal probability density function, time series analysis, and artificial intelligence. (See Jannat et al.; Liu et al.; Mojtahedzadeh et al.; Siano et al.; and X. Zhang, J. Wang, and K. Zhang, "Short-term electric load forecasting based on singular spectrum analysis and support vector machine optimized by Cuckoo search algorithm," *Electr. Power Syst. Res.*, Vol. 146, pp. 270-285, May 2017, each incorporated herein by reference in their entirety).

A ±10% deviation of the predicted peak values of load demand, active power outputs of photovoltaic (PV) and wind power plants while enhancing resiliency and reliability through self-healing of a community micro-grid was determined. A maximum of ±10% and ±15% relative errors of the load demand and active power output of PV power plant respectively, were used to model a robust voltage control for an active distribution grid. (See Yongjie Wang, Wenchuan Wu, Boming Zhang, Zhengshuo Li, and Weiye Zheng, "Robust voltage control model for active distribution network considering PVs and loads uncertainties," in 2015 *IEEE Power & Energy Society General Meeting*, 2015, pp. 1-5, incorporated herein by reference in its entirety).

Further research included ±16% and ±20% variations of active power generation of the PV power plant and load demand respectively, while proposing a robust restoration approach of an active distribution grid. (See X. Chen, W. Wu, B. Zhang, and X. Shi, "A robust approach for active distribution network restoration based on scenario techniques considering load and DG uncertainties," in 2016 *IEEE Power and Energy Society General Meeting (PESGM)*, 2016, pp. 1-5, incorporated herein by reference in its entirety).

As discussed above, most of the distribution grid fault diagnosis methods developed did not consider the uncertainties associated with the load demand and renewable energy generation, fault information (resistance and inception angle), and presence of measurement noise.

In recent years, machine learning tools in combination with advanced signal processing techniques have been used to analyze power systems transients. (See M. Ijaz, M. Shafiullah, and M. A. Abido, "Classification of power quality disturbances using Wavelet Transform and Optimized ANN," 2015 18*th International Conference on Intelligent System Application to Power Systems* (*ISAP*), *Proceedings of the Conference on*. pp. 1-6, September-2015; A. C. Adewole, R. Tzoneva, and S. Behardien, "Distribution network fault section identification and fault location using wavelet entropy and neural networks," *Appl. Soft Comput.*, Vol. 46, pp. 296-306, 2016; and A. Aljohani, A. Aljurbua, M. Shafiullah, and M. A. Abido, "Smart fault detection and classification for distribution grid hybridizing ST and MLP-NN," 2018 15*th International Multi-Conference on Systems, Signals & Devices* (*SSD*). IEEE, Hammamet, Tunisia, pp. 1-5, April-2018, each incorporated herein by reference in their entirety).

Aspects of the present disclosure describe an intelligent fault diagnosis (IFD) method, system and apparatus for the distribution grid which combine advanced signal processing and machine learning. The uncertainties associated with load demand, renewable energy generation, and fault information (resistance and inception angle) through different probability density functions are incorporated. Furthermore, the effectiveness of the IFD method in the presence of measurement noise is demonstrated.

SUMMARY

In an exemplary embodiment, a method is described for intelligent fault diagnosis of a distribution feeder connected to renewable energy resources, comprising modelling, with a computing system having circuitry configured for modelling and processing, the distribution feeder, the distribution feeder having predetermined electrical characteristics, wherein the distribution feeder is divided into sections separated by nodes, wherein each node is connected to at least one of a power input or a power output, wherein at least one power input is a renewable energy resource and at least one power input is a main feeder, determining uncertainties in the energy supply of at least one renewable energy resource connected to a power input node by a first probability density function describing a load demand of at least one power output node and a second probability density function describing uncertainties in the energy supply of the at least one renewable energy resource, generating, from the modelling, a first dataset of three phase current signals of a plurality of branches of the distribution grid, generating, from the modelling, a second dataset of three phase current signals of the main feeder and at least one renewable energy resource, analyzing the first dataset and the second dataset to extract features of each section, recording the current signals at each power output node, determining whether a section has a fault by comparing the current signals at each power output node to the extracted features of each section, locating and classifying the fault, and displaying the features of the fault and the fault location.

In another exemplary embodiment, a non-transitory computer readable medium having instructions stored therein that, when executed by one or more processors, causes the one or more processors to perform a method for intelligent fault diagnosis of a distribution feeder connected to renewable energy resources is described, comprising modelling, with a computing system having circuitry configured for modelling and processing, the distribution feeder, the distribution feeder having predetermined electrical characteristics, wherein the distribution feeder is divided into sections separated by nodes, wherein each node is connected to at least one of a power input or a power output, wherein at least one power input is a renewable energy resource and at least one power input is a main feeder, determining uncertainties in the energy supply of at least one renewable energy resource connected to a power input node by a first probability density function describing a load demand of at least one power output node and a second probability density function describing uncertainties in the energy supply of the at least one renewable energy resource, generating, from the modelling, a first dataset of three phase current signals for a plurality of pre-specified branches of the distribution grid, generating, from the modelling, a second dataset of three phase current signals of the main feeder and at least one renewable energy resource, analyzing the first dataset and the second dataset to extract features of each section, recording the current signals at each power output node, determining whether a section has a fault by comparing the current signals at each power output node to the extracted features of each section, locating and classifying the fault, and displaying, by a display, the features of the fault and the fault location.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
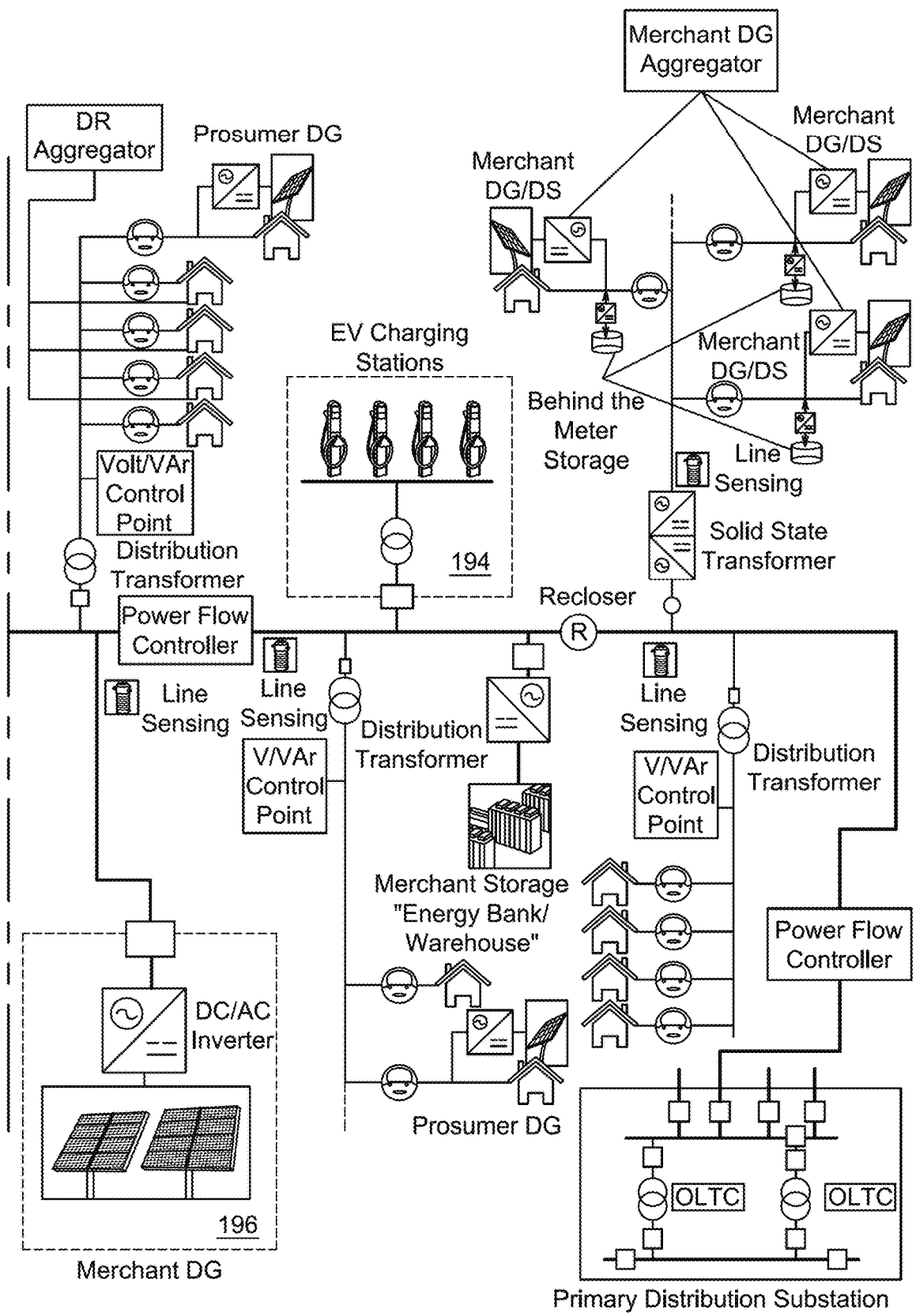
FIG. 1 illustrates an example of a distribution grid with multiple feeder lines.

In the drawings, like reference numerals designate identical or corresponding parts throughout the several views.

Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to a method and system for intelligent fault diagnosis of a distribution feeder connected to renewable energy resources and a non-transitory computer readable medium having instructions stored therein that, when executed by one or more processors, causes the one or more processors to perform a method for intelligent fault diagnosis of a distribution feeder connected to renewable energy resources.

Aspects of the present disclosure describe versatile intelligent fault diagnosis (IFD) methods for a distribution grid feeder which integrates power from intermittent renewable energy resources. In one embodiment, a distribution feeder is modelled incorporating load demand, renewable energy generation (wind speed and solar irradiation), and fault information (resistance and inception angle) uncertainties by employing different probability density functions (PDF). Advanced signal processing techniques are used to extract useful features from the recorded current waveforms. These extracted features are input to a multilayer perceptron neural network (MLP-NN) to diagnose (i.e., to detect, classify, identify faulty section and locate) the faults. Once a fault is detected, classified and located, a grid operator may adjust grid/feeder parameters or dispatch a technician to correct the faults.

The steps of the intelligent fault diagnosis (IFD) method and system which incorporate uncertainties associated with load demand and renewable energy generation are described below.

A. Test Distribution Feeder Specification and Modeling

In general, distribution feeders are passive networks with unidirectional energy flow from a source to the load centers. They consist of a main feeder, distribution transformers, laterals and sub-laterals, spot and distributed loads, shunt capacitor banks, overhead distribution lines and underground cables. Benchmark feeders have been described with detailed configurations by the Power & Energy Society (PES) of the Institute of Electrical and Electronics Engineers (IEEE) (See "Distribution Test Feeders—Distribution Test Feeder Working Group—IEEE PES Distribution System Analysis Subcommittee." http://sites.ieee.org/pes-testfeeders/resources/, incorporated herein by reference in its entirety).

A feeder is one of the circuits out of a substation. The main feeder is the three-phase backbone of the circuit, which is often called the mains or mainline. Branching from the mains are one or more laterals, which are also called taps, lateral taps, branches, or branch lines. These laterals may be single-phase, two-phase, or three-phase.

An example of a distribution grid 190 connected to various sources, such as wind plants 192, a photovoltaic collector 196 and EV charging stations 194, includes feeders for distributing power is shown in FIG. 1. (See Taft, J D, De Martini, P., "A Reference Model for Distribution Grid Control in the 21st Century", Pacific Northwest National Laboratory, July 2015, U.S. Department of Energy, https://energyenvironment.pnnl.gov/pdf/Distribution_Control_Ref_Model_v1.1_final.pdf, incorporated herein by reference in its entirety)

In an aspect of the present disclosure, an IEEE 13-node test feeder (FIG. 2A) is used in the experimental validation of the IFD method and system, as a single simulator rack can simulate electricity grids with a limited number of nodes. In a non-limiting example, an RTDS rack is used as the simulator rack. (See: RTDS Technologies, https://www.rtds.com/real-time-power-system-simulation/, incorporated herein by reference in its entirety).

The 13-node test feeder operates at 4.16 kV and exhibits most of the characteristics of electric distribution feeders. This highly loaded test feeder includes a single voltage regulator 605, an in-line transformer 607, overhead distribution lines and underground cables of various configurations, several unbalanced spot and distributed loads, and shunt capacitor banks. Additionally the 13-node feeder may contain three-phase, double-phase, and single-phase laterals. For explanatory purposes only, lateral 632-634 may be a three phase lateral, lateral 671-672 may be a double phase lateral, and lateral 632-646 may be a single phase lateral.

In non-limiting examples, the feeder was modelled in RSCAD software (See: "RSCAD is RTDS Technologies' proprietary power system simulation software, designed specifically for interfacing to the RTDS Simulator hardware", https://www.rtds.com/the-simulator/our-software/about-rscad/, incorporated herein by reference in its entirety) and simulates the feeder in a single RTDS (Real Time Digital Power Simulator) rack.

B. Incorporation of Renewable Energy Resources

Figure 2A:
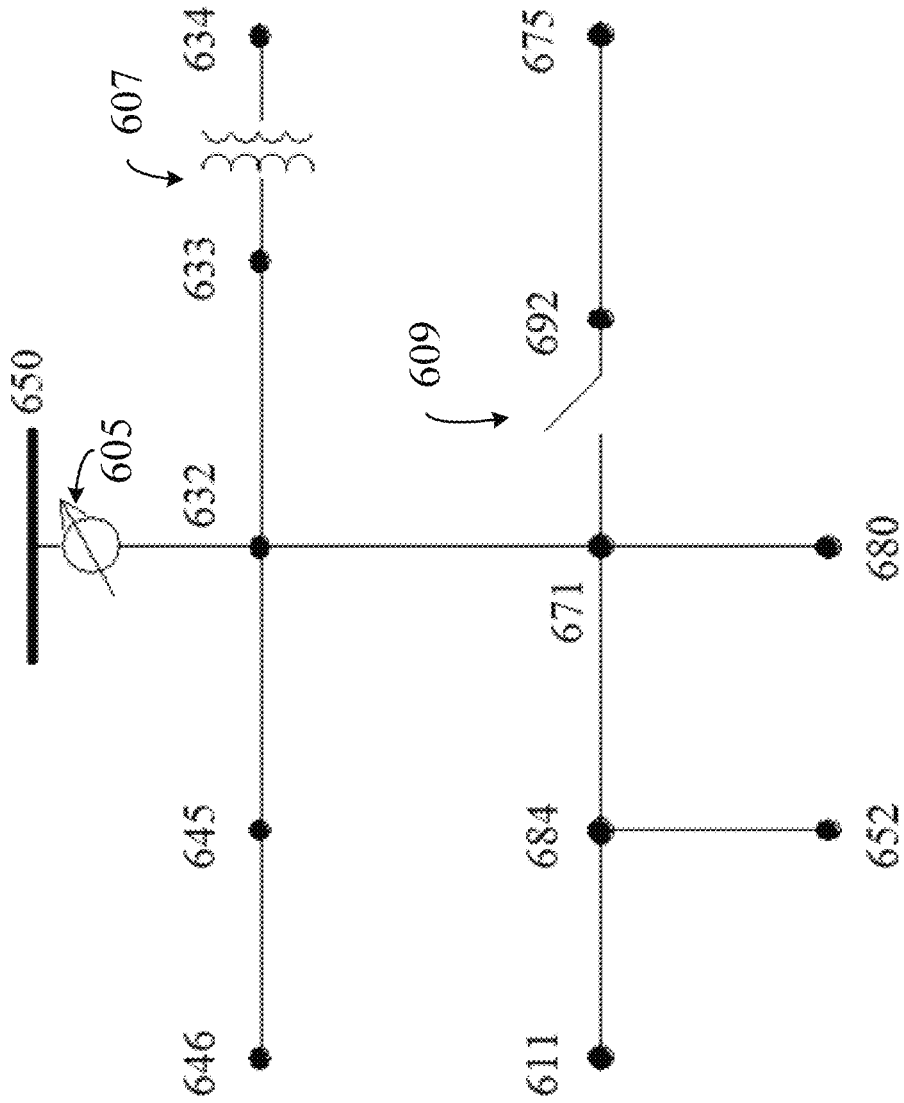
FIG. 2A illustrates the IEEE 13-node test distribution feeder.
Figure 2B:
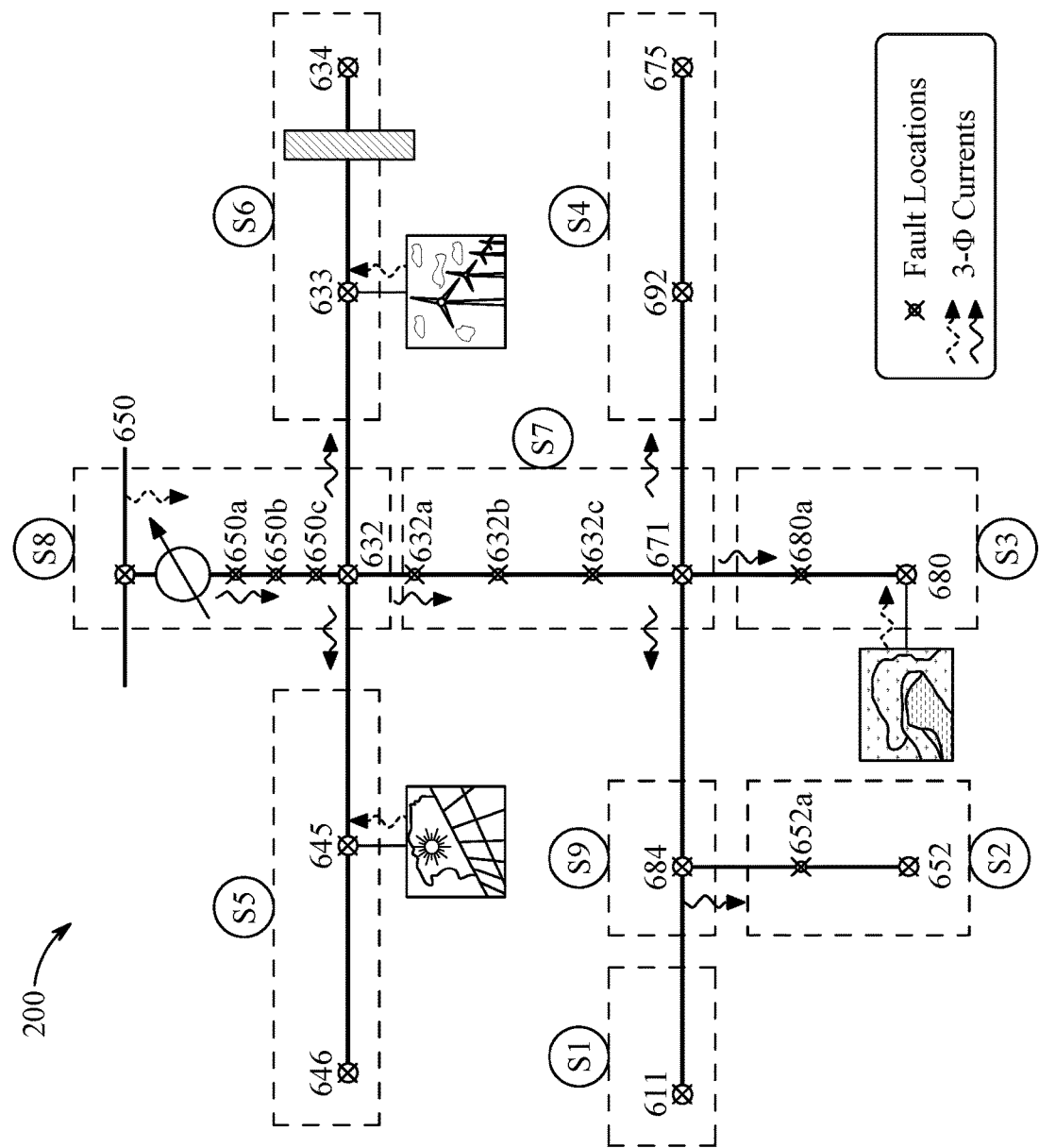
FIG. 2B illustrates the IEEE 13-node test distribution feeder with three renewable energy resources incorporated.

In an aspect of the present disclosure, the feeder incorporates three renewable energy resources: photovoltaic (PV) 645, wind 633 and hydropower power plants 680 as shown in FIG. 2B. The hydropower plant is considered as a fixed power supplier on the test feeder whereas PV and the wind power plants supply power based on solar irradiation and wind speed using sliders to simulate the power variability. The sliders may be accessed from the RSCAD library. FIG. 2B illustrates the test distribution feeder of FIG. 2A incorporated with three different renewable energy resources. The renewable energy resources may also include a geothermal energy source and/or a wave energy source.

C. Load Demand and Renewable Energy Generation Uncertainties Modeling

The uncertainties associated with load demand and renewable energy generation are incorporated into the test distribution feeder with the aid of a probabilistic analysis, as probabilistic approaches have been demonstrated to lower operational cost compared to deterministic analysis.

The load demand uncertainty model employs the normal probability density function (PDF) given below:

$$f(x_L \mid \mu_L, \sigma_L) = \frac{1}{\sigma_L \sqrt{2\pi}} e^{-\frac{(x_L - \mu_L)^2}{2\sigma_L^2}} \quad \text{for} \quad -\infty < x_L < \infty, \quad (1)$$

$$\mu_L < \infty, \sigma_L > 0$$

The variables $\mu_L$, $\sigma_L$ and $C_{vL}$ are related using the following formula:

$$C_{vL} = \frac{3\sigma_L}{\mu_L} \times 100\% \quad (2)$$

where $\mu_L$ is the rated active load mean value and $C_{vL}$ is ±15% of the rated load respectively. $\sigma_{vL}$ is the standard deviation.

The uncertainties associated with wind speed variations at the wind power plant are incorporated by employing the Weibull probability density function as:

$$f(x_w \mid \alpha_w, \beta_w, \gamma_w) = \frac{\beta_w}{\alpha_w}\left(\frac{x_w - \gamma_w}{\alpha_w}\right)^{\beta_w - 1} e^{-\left(\frac{x_w - \gamma_w}{\alpha_w}\right)^{\beta_w}} \text{ for} \quad (3)$$

$$x_w \geq \gamma_w \text{ and } \alpha_w, \beta_w > 0$$

where $\alpha_w$ is the scale parameter of the distribution, $\beta_w$ is the shape parameter and $\gamma_w$ is the location value of the variable $x_w$ of the distribution related to the wind speed.

The case where $\gamma_w=0$ is known as the two parameter Weibull probability density function and can be re-written as:

$$f(x_w \mid \alpha_w, \beta_w) = \frac{\beta_w}{\alpha_w}\left(\frac{x_w}{\alpha_w}\right)^{\beta_w - 1} e^{-\left(\frac{x_w}{\alpha_w}\right)^{\beta_w}} \text{ for } x_w \geq 0; \quad (4)$$

$$\alpha_w, \beta_w > 0$$

Likewise, the uncertainties associated with variation in solar irradiation energy at the photovoltaic power plant are incorporated by employing the Weibull probability density function as:

$$f(x_s \mid \alpha_s, \beta_s) = \frac{\beta_s}{\alpha_s}\left(\frac{x_s}{\alpha_s}\right)^{\beta_s - 1} e^{-\left(\frac{x_s}{\alpha_s}\right)^{\beta_s}} \text{ for } x_s \geq 0; \quad (5)$$

$$\alpha_s, \beta_s > 0$$

where $\alpha_s$ is the scale parameter and $\beta_s$ is the shape parameter of the variable $x_s$ of the distribution related to solar irradiation.

The scale and shape parameters are selected through a backward iterative process from the mean and standard deviations associated with the wind speed and solar irradiation. The mean value of the outputs of the wind power and PV power plant was estimated to be 500 kW and 300 kW, respectively. The coefficient of variation is assumed to be ±10% of the rated wind speed and rated solar irradiation.

Based on the Weibull probability density function predicted wind speed, the output power of wind power plant can be calculated using the following equation:

$$P_w(v) = \begin{cases} 0 & 0 \leq v \leq v_{ci} \text{ or } v_{co} \leq v \\ P_{wrated} \times \frac{v - v_{ci}}{v_r - v_{ci}} & v_{ci} \leq v \leq v_r \\ P_{wrated} & v_{co} \leq v \end{cases} \quad (6)$$

where $v$ is the Weibull probability density function predicted wind speed, $v_r$ is the rated wind speed, $v_{ci}$ is the cut-in wind speed and $v_{co}$ is the cut-off wind speed.

Similarly, the output power of the PV (solar) plant can be calculated from the Weibull probability density function predicted solar irradiation as:

$$P_s(s) = \begin{cases} P_{srated} \times \frac{G}{G_r} & 0 \leq G \leq G_r \\ P_{srated} & G_r \leq G \end{cases} \quad (7)$$

where G and $G_r$ are the Weibull PDF predicted and rated solar irradiations, respectively.

The reactive power outputs of photovoltaic solar and wind plants are assumed as the negative (~7%) and positive (~50%) of their generated active powers, respectively. Also, the real and reactive powers are set to constant values for the hydropower plant installed at node 680. The power output is set to a constant value (300 kW) for the hydropower plant installed at node 680. Similar to the load demand and the DG generation uncertainties, the fault resistance (R) is chosen by employing a uniform probability density function (U) that picks a random value from the given range of the following equation:

$$R \sim U(R_{min}, R_{max}) \quad (8)$$

where, $R_{min}$ and $R_{max}$ are the minimum and the maximum values of fault resistance, respectively, and are set at $R_{min}=0\Omega$ and $R_{max}=50\Omega$ for the testing.

D. Fault Modeling and Data Recording

Script files for "batch-mode" operation of RSCAD software are employed to simulate several configurations and record faulty current signals of the same fault type on a specific location automatically without any manual interaction. The script files are written in a 'C' like programming language to incorporate the load demand, renewable energy generation, and fault information (resistance and inception angle) uncertainties. Each fault was simulated for four cycles and data was recorded in the RSCAD environment for two cycles (one pre-cycle and one post-cycle) with a sampling frequency of 10 kHz (~167 samples/cycle). Hence, two datasets were recorded. The first (pre-cycle) dataset consisted of three-phase current signals recorded from eight pre-selected branches (650 to 632, 632 to 671, 632 to 633, 632 to 645, 671 to 680, 671 to 684, 684 to 652, and 671 to 675) and the second (post-cycle) dataset contained the current signals of the main feeder and the three renewable energy resources (FIG. 2). Hundreds of faults on 21 locations (FIG. 2) were applied to the feeder by varying fault types (AG, BG, CG, ABG, BCG, CAG, and ABCG, referring to three phase lines A, B, C and ground G) and incorporating the load demand, renewable energy generation, fault information uncertainties. Although the example above for the 13 node feeder model uses eight pre-selected branches and three renewable energy resources, fewer branches may be selected and one or two renewable energy resources may be modelled. Additionally, the methods of the present disclosure are not limited to the 13 node feeder example. Extrapolation of the 13 node feeder methods to a real life distribution grid would necessarily comprise many more branches and a plurality of renewable and other energy resources.

E. Feature Extraction

After both datasets were recorded for the applied faults, two advanced signal processing techniques, the discrete wavelet transform (DWT) and the Stockwell transform (ST), were employed to extract characteristic features. The DWT decomposed each phase current signal into one approximate and seven detailed coefficients. Hence, it collected twenty-four coefficients from each branch current signal, as there are three phases in each branch current signal. Then, it extracted six statistical indices namely the entropy, energy, skewness, kurtosis, mean, and standard deviation from each coefficient. Therefore, the DWT extracted 144 features (=3-phase current signal×8-coefficients×6 statistical indices per coefficient) from each branch current signal. Finally, it extracted 1152 features (=144 features per branch current signal×8-branches) from the first dataset for each faulty case. Details of DWT based feature extraction are available in [See M. Shafiullah, M. A. Abido, Z. Al-Hamouz, "Wavelet-based extreme learning machine for distribution grid fault location", IET Gener. Transm. Distrib., Vol. 11 Iss. 17, pp. 4256-4263, 2017].

On the other hand, the ST extracted 36 features from each branch current signal. Therefore, it extracted 288 features (=36 features per branches×8-branches) from the first dataset for each faulty case. Details of ST based feature extraction are available in [See M. Shafiullah, M. A. Abido, T. Abdel-Fattah, "Distribution Grids Fault Location employing ST based Optimized Machine Learning Approach", Energies, Vol. 11, pp. 1-23, 2018].

Likewise, the DWT and ST extracted 576 (=144 features from each three-phase signal×4 sources) and 144 features (=36 features from each three-phase current signal×4 sources) respectively, from the second dataset for each faulty case.

F. Training of the MLP-NN for Fault Diagnosis

Figure 3:
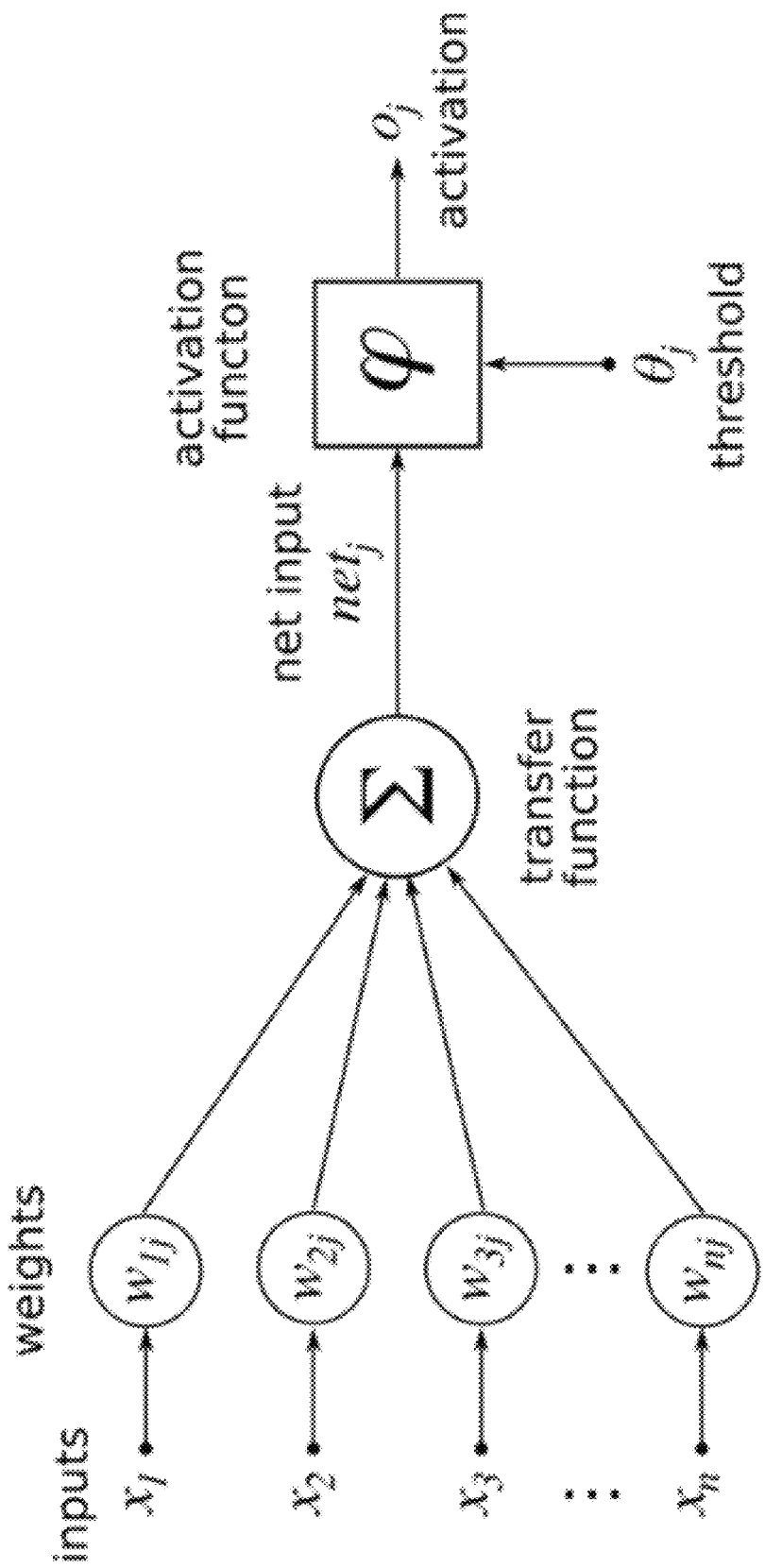
FIG. 3 illustrates a multilayer perceptron neural network.

All extracted features were fetched from the first dataset as inputs to a detection multilayer perceptron neural network (MLP-NN), to a classification MLP-NN, and to a section identification MLP-NN for training and testing purposes. Similarly, the features of the second datasets were also fetched as inputs to another set of detection, classification, and section identification MLP neural networks. However, if a detected fault occurred on the main branch, the features collected from the current signals of the main feeder and hydro power plant were sent to another MLP neural network to locate the faults as a regression problem. The number of hidden neurons of the above-mentioned MLP neural networks was selected through a systematic trial and error approach based on their accuracies. A multilayer perceptron neural network and its activation function are shown in FIG. 3.

An activation function determines whether or not a signal should be output. There are a number of common activation functions in use with neural networks. A step function may be an activation function, in which the output is (1) or activated when a value is above a threshold and is (0) otherwise. A sigmoid function has the property of being similar to the step function, but with the addition of a region of uncertainty.

A continuous tan-sigmoid function is given by the relationship:

$$(x) = \tanh(x) = \frac{ex\overline{e} - x}{ex + e - x}.$$

Figure 4:
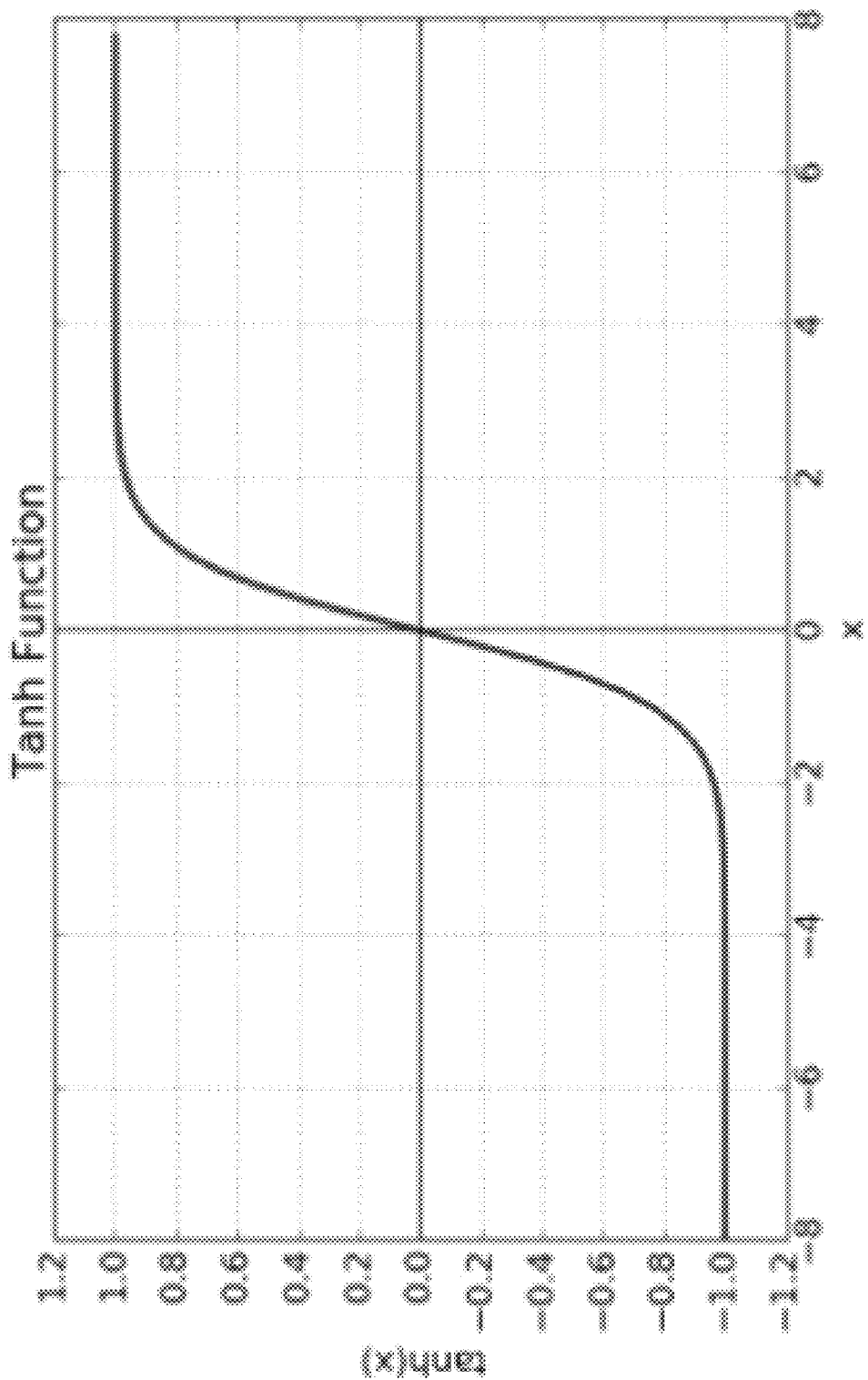
FIG. 4 illustrates the graph of a tan-sigmoid function.

FIG. 4 illustrates the graph of a tan-sigmoid function. The tan-sigmoid were selected as squashing functions to compress the output and as resilient backpropagation as training algorithms for the neural networks.

The first embodiment is illustrated with respect to FIGS. 2-6. The first embodiment describes a method for intelligent fault diagnosis of a distribution feeder 200 connected to a plurality of renewable energy resources (633, 645, 680), in which a controller retrieves from a database 604 predetermined electrical characteristics of the distribution feeder, wherein the distribution feeder is divided into branches separated by nodes (for example, see the branch between node 632 and node 633, FIG. 2), wherein each node is connected to at least one of a power input (633, 645, 650, 680) or a power output (611, 634, 646, 675, for example), wherein at least one power input is a renewable energy resource (633, 645, 680) and at least one power input is a main feeder 650.

The method continues by modelling uncertainties in the energy supply of at least one renewable energy resource connected to a power input node by a first probability density function (see 608, FIG. 6) of a load demand of at least one power output node and by a second probability density function of the uncertainties in the energy supply of at least one renewable energy resource connected to a power input node and generating, from the modelling, a first dataset of three phase current signals of a plurality of branches for each output node of each section of the distribution grid (for example, eight branches of the 13 node feeder model shown in FIG. 2A), generating, from the modelling, a second dataset of three phase current signals of the main feeder and at least one renewable energy resource (for example, solar, wind or hydroelectric energy or a combination of solar, wind and hydroelectric energy resources), and analyzing the first dataset and the second dataset to extract features of each branch by inputting the first and second datasets to a short-time Fourier transform combined with a wavelet transform (see Fourier/wavelet module 606, which has two transforms, a discrete wavelet transform and a Stockwell transform). The method proceeds by recording (with a physical phasor measurement unit, PMU 620), the current signals at each power output node; determining whether a branch has a fault by comparing the current signals (by tan-sigmoid comparator in MLP-NN 609) at each power output node to the extracted features of each branch; locating and classifying the fault; and displaying (see display 624) the features of the fault and the fault location.

The renewable energy resource is at least one of a wind energy source 633, a solar energy source 645, a hydroelectric power source 680, a geothermal energy source and a wave energy source.

Locating and classifying faults comprises inputting the extracted features to a multilayer perceptron neural network (MLP-NN 609); comparing each set of current signals from PMU 620 at each node to the extracted features; and outputting the class (SNR) and location of each fault from the multilayer perceptron neural network.

The multilayer perceptron neural network 609 further comprises an activation function for comparing each set of current signals at each node to the extracted features and generating an output, wherein the activation function is a continuous tan-sigmoid function given by the equation:

$$\sigma(x) = \tanh(x) = \frac{ex\overline{e} - x}{ex + e - x}.$$

Outputting the class of each fault comprises comparing the signal to noise ratio of the current values of each node to extracted features of each section.

Recording (by PMU 620) three phase current signals includes measuring the frequencies and phasors at each of the output nodes.

Modelling the load demand comprises inputting the electrical characteristics to the first probability density function given by $$f(x_L | \mu_L, \sigma_L) = \frac{1}{\sigma_L\sqrt{2\pi}} e^{-\frac{(x_L - \mu_L)^2}{2\sigma_L^2}} ; -\infty < x_L < \infty, \mu_L < \infty, \sigma_L > 0$$

where $x_L$ is a variable indicating the location of a node under consideration, $\mu_L$ is the rated active load, $\sigma_L$ is the standard deviation.

In general, modelling the uncertainties in the energy supply of at least one renewable energy resource in general comprises inputting the electrical characteristics to the second probability density function given by $$f(x \mid \alpha, \beta, \gamma) = \frac{\beta}{\alpha}\left(\frac{x-\gamma}{\alpha}\right)^{\beta-1} e^{-\left(\frac{x-\gamma}{\alpha}\right)^{\beta}}; x \geq \gamma, \alpha, \beta > 0$$

where x is a variable indicating the location of a node under consideration, $\alpha$ is the scale parameter of a distribution of the probability density function, $\beta$ is the shape parameter related to the slope of the distribution of the probability density function and $\gamma$ is the lower boundary of the variable x.

Modelling the uncertainties in the wind speed of the wind energy source comprises inputting the electrical characteristics to the second probability density function given by $$f(x_w \mid \alpha_w, \beta_w) = \frac{\beta_w}{\alpha_w}\left(\frac{x_w}{\alpha_w}\right)^{\beta_w-1} e^{-\left(\frac{x_w}{\alpha_w}\right)^{\beta_w}} \text{ for } x_w \geq 0; \alpha_w, \beta_w > 0$$

where $x_w$ is a variable indicating the location of a node under consideration, $\alpha_w$ is the scale parameter of the distribution, $\beta_w$ is the shape parameter related to the slope of the distribution of the probability density function.

Modelling the uncertainties in the solar irradiation of the solar energy source includes inputting the electrical characteristics to the second probability density function given by $$f(x_s \mid \alpha_s, \beta_s) = \frac{\beta_s}{\alpha_s}\left(\frac{x_s}{\alpha_s}\right)^{\beta_s-1} e^{-\left(\frac{x_s}{\alpha_s}\right)^{\beta_s}} \text{ for } x_s \geq 0; \alpha_s, \beta_s > 0$$

where $x_s$ is a variable indicating the location of a node under consideration, $\alpha_s$ is the scale parameter of a distribution of the probability density function, $\beta_s$ is the shape parameter related to the slope of the distribution of the probability density function.

The method further comprises calculating the power output of the wind energy source by:

$$P_w(v) = \begin{cases} 0 & 0 \leq v \leq v_{ci} \text{ or } v_{co} \leq v \\ P_{wrated} \times \frac{v - v_{ci}}{v_r - v_{ci}} & v_{ci} \leq v \leq v_r \\ P_{wrated} & v_{co} \leq v \end{cases}$$

where v is the Weibull probability density function predicted wind speed, $v_r$ is the rated wind speed, $v_{ci}$ is the cut-in wind speed and $v_{co}$ is the cut-off wind speed.

The method further comprises calculating the power output of the solar energy source by:

$$P_s(s) = \begin{cases} P_{srated} \times \frac{G}{G_r} & 0 \leq G \leq G_r \\ P_{srated} & G_r \leq G \end{cases}$$

where G and $G_r$ are the Weibull PDF predicted and rated solar irradiations, respectively.

The method comprises calculating a fault resistance, R, at a faulty node by: $R \sim U(R_{min}, R_{max})$ where U is a uniform probability density function, $R_{min} = 0\Omega$, $R_{max} = 50\Omega$.

The second embodiment is illustrated with respect to FIG. 2-6. The second embodiment describes a non-transitory computer readable medium 640 having instructions stored therein that, when executed by one or more processors 602, causes the one or more processors to perform a method for intelligent fault diagnosis of a distribution feeder 200 connected to renewable energy resources (633, 645, 680), comprising retrieving, by computer circuitry 601 connected to a database 604, predetermined electrical characteristics of the distribution feeder, wherein the distribution feeder is divided into sections separated by nodes (for example, see the section between node 632 and node 633, FIG. 2), wherein each node is connected to at least one of a power input or a power output, wherein at least one power input is a renewable energy resource (633, 645, 680) and at least one power input is a main feeder 650.

The non-transitory computer readable medium further comprises modelling, by processing circuitry, the distribution feeder by a first probability density function (see 608, FIG. 6) to describe a load demand of at least one power output node and a second probability density function to describe uncertainties in the energy supply of the at least one renewable energy resource connected to a power input node, generating, from the modelling, a first dataset of three phase current signals for a plurality of branches of the distribution grid (for example, eight branches as shown in FIG. 2A for the 13 node feeder model) and generating, from the modelling, a second dataset of three phase current signals of the main feeder and the at least one renewable energy resource (for example, solar, wind or hydroelectric energy or a combination of solar, wind and hydroelectric energy resources). The method continues by analyzing the first dataset and the second dataset to extract features of each branch, by inputting the first and second datasets to a short-time Fourier transform combined with a wavelet transform (see Fourier/wavelet module 606, which has two wavelet models, a discrete wavelet transform and a Stockwell transform). The method proceeds by recording the current signals at each power output node (by PMU 620) and determining whether a branch has a fault by comparing the current signals at each power output node to the extracted features of each branch, locating and classifying the fault and displaying, by a display, the features of the fault and the fault location.

A further feature of the non-transitory computer readable medium method comprises locating and classifying faults by inputting the extracted features to a multilayer perceptron neural network (MLP-NN); comparing each set of current signals at each node to the extracted features; and outputting the class and location of each fault from the multilayer perceptron neural network.

A discussion of the advanced signal processing techniques and machine learning tools employed to develop the IFD method and system is presented below.

A. Wavelet Transform

The Fourier transform (FT) was the first-generation signal-processing technique to analyze stationary signals effectively but provides erroneous information while dealing with non-stationary signals due to loss of temporal data. A short-time Fourier transform (STFT) that uses fixed sampling windows of a regular interval and decomposes non-stationary signals into the frequency domain may be used, but may cause resolution problems between frequency and time such that a good time resolution decomposition provides a poor frequency resolution and vice versa. A wavelet transform (WT) uses bigger windows at lower frequencies and smaller windows at higher frequencies while decomposing the signals into series of wavelet components to solve the resolution issue faced by the STFT. The WT has two major branches: the continuous wavelet transform (CWT) and the discrete wavelet transform (DWT). DWT combined with Daubechies, Haar, Mallat, Morlet, and Meyer mother wavelets are used in analyzing power system signals due to their simplicity. (See A. Borghetti, S. Corsi, C. A. Nucci, M. Paolone, L. Peretto, and R. Tinarelli, "On the use of continuous-wavelet transform for fault location in distribution power systems," Int. J. Electr. Power Energy Syst., Vol. 28, No. 9, pp. 608-617, November 2006, incorporated herein by reference in its entirety).

B. Stockwell Transform

The Wavelet Transform (WT) resolves the resolution issue of the short-time Fourier transform (STFT) through the implementation of multi-resolution analysis. However, the WT is sensitive to the presence of measurement noise and does not uphold the phase information of the non-stationary signals. An advanced signal processing technique (SPT), namely the Stockwell transform (ST) combines the benefits of the STFT and WT, effectively upholding the referenced frequency and phase information.

C. Multilayer Perceptron Neural Network

The artificial neural networks (ANN) possess parallel computing abilities in addition to their adaptiveness to external disturbances. Hence, ANN has become a popular machine learning tool and is employed in many engineering fields. (See M. J. Rana, M. S. Shahriar, and M. Shafiullah, "Levenberg-Marquardt neural network to estimate UPFC-coordinated PSS parameters to enhance power system stability," Neural Comput. Appl., pp. 1-12, July 2017; Y. Sun, S. Li, B. Lin, X. Fu, M. Ramezani, and I. Jaithwa, "Artificial Neural Network for Control and Grid Integration of Residential Solar Photovoltaic Systems," IEEE Trans. Sustain. Energy, Vol. 8, No. 4, pp. 1484-1495, October 2017; and S. Masiur Rahman, A. N. Khondaker, M. Imtiaz Hossain, M. Shafiullah, and M. A. Hasan, "Neurogenetic modeling of energy demand in the United Arab Emirates, Saudi Arabia, and Qatar," Environ. Prog. Sustain. Energy, Vol. 36, No. 4, 2017, each incorporated herein by reference in their entirety). Multilayer perceptron neural networks (MLP-NN) are widely used artificial neural networks and consist of input, hidden, and output layers. The inputs to the MLP-NN are processed in the hidden layer through the aid of squashing functions and then are sent to the output layer. The supervised learning algorithm tunes the initial connecting weights and biases of different layers to minimize the training errors.

The effectiveness of the IFD method and system of the present disclosure and its independence on the load demand, renewable energy generation, fault information uncertainties, and the presence of measurement noise is described below. The effectiveness of the IFD is confirmed under various contingency cases (i.e., branch outage, wind power plant outage, and solar power plant outage). A laboratory prototype for the IFD method and system was built by integrating the physical phasor measurement units (PMU) with a Real Time Digital Simulator (RTDS) and used to evaluate the results. These results validated the effectiveness of the IFD method and system, showing good agreement with the simulation results.

The results obtained by the intelligent fault diagnosis method and system under load demand, renewable energy generation, and fault information uncertainties are detailed below.

A. Fault Detection Results

DWT and ST based features were collected in the first dataset (pre-cycle) for 1,050 faulty cases by varying fault type and location considering the load demand, renewable energy generation, fault information uncertainties. Features from 1,050 non-faulty cases incorporating the load demand and renewable energy generation uncertainties were also collected. The detection MLP neural networks were trained and tested using a different number of neurons and the best ones were selected based on overall performance. The results presented in Table I demonstrate that the IFD successfully differentiated the faulty cases from their non-faulty counterparts, even in the presence of measurement noises. Additionally, the results confirmed that the ST based approach was more accurate than the DWT based approach.

TABLE 1

| | Fault detection results based on the first dataset | | | | | | | |
|---|---|---|---|---|---|---|---|---|
| | Samples classified successfully | | | | | | | |
| | Noise free | | 40 dB SNR | | 30 dB SNR | | 20 dB SNR | |
| Item | DWT | ST | DWT | ST | DWT | ST | DWT | ST |
| Faulty cases | 1046 | 1048 | 1038 | 1043 | 1029 | 1040 | 1023 | 1036 |
| Non-faulty cases | 1050 | 1050 | 1046 | 1050 | 1043 | 1047 | 1041 | 1045 |
| Overall Accuracy (%) | 99.81 | 99.91 | 99.24 | 99.67 | 98.67 | 99.38 | 98.29 | 99.09 |

In a similar manner, the fault detection results of second dataset (see Table AA) also confirmed the efficacy of the signal processing based machine learning approach of the present disclosure. These results also prove that the ST based approach outperforms the DWT based approach.

TABLE AA

Fault Detection Results based on Second Dataset

| | Samples classified successfully | | | | | | | |
|---|---|---|---|---|---|---|---|---|
| | Noise free | | 40 dB SNR | | 30 dB SNR | | 20 dB SNR | |
| Item | DWT | ST | DWT | ST | DWT | ST | DWT | ST |
| Faulty cases | 1039 | 1041 | 1027 | 1035 | 1019 | 1031 | 992 | 1025 |
| Non-faulty cases | 1050 | 1050 | 1050 | 1048 | 1042 | 1047 | 1041 | 1043 |
| Overall Accuracy (%) | 99.47 | 99.57 | 98.90 | 99.19 | 98.14 | 98.95 | 96.80 | 98.47 |

B. Fault Classification Results

Seven different types of faults were applied as shown above by varying fault locations under load demand, renewable energy generation, and fault information uncertainties. Hence, the classification neural networks (MLP-NN) were trained and tested with different numbers of hidden neurons, after collection of the DWT and ST based features for 700 faulty cases of each type. The most accurate networks were selected.

Table II below summarizes the fault classification results of the IFD technique for the first dataset. The results demonstrate the effectiveness of the classification approach, even in the presence of measurement noises. Moreover, it can be seen from the results that the ST based approach outperformed the DWT based approach in terms of overall accuracy (see % Accuracy, Table II).

Similarly, fault classification results for the second dataset (see Table AB) also confirm the efficacy of the proposed signal processing based machine learning approach. This table also points out that the ST based approach outperforms the DWT based approach.

C. Faulty Section Identification Results

The test feeder was divided into nine sections (S1-S9, FIG. 2) and DWT and ST based features were collected for 900 faulty cases from each section by varying fault types and points under the load demand, renewable energy generation, and fault information uncertainties. The faulty section identification neural networks were tested and trained with different numbers of hidden neurons and the most accurate were chosen. As can be observed from the results presented in Table III, the IFD technique successfully identified the faulty sections from their non-faulty counterparts, even in the presence of measurement noises. Additionally, the results confirm that the ST outperforms the DWT based approach (see % Accuracy, Table III).

TABLE II

Fault Classification Results based on First Dataset.

| | Samples classified successfully | | | | | |
|---|---|---|---|---|---|---|
| | Noise free | | 40 dB SNR | | 20 dB SNR | |
| Fault type | DWT | ST | DWT | ST | DWT | ST |
| AG | 699 | 700 | 699 | 700 | 697 | 698 |
| BG | 699 | 700 | 698 | 699 | 695 | 699 |
| CG | 700 | 700 | 700 | 700 | 698 | 698 |
| ABG | 700 | 700 | 699 | 698 | 696 | 699 |
| BCG | 699 | 700 | 698 | 700 | 698 | 697 |
| CAG | 700 | 700 | 699 | 699 | 697 | 698 |
| ABCG | 700 | 700 | 700 | 700 | 698 | 699 |
| Accuracy (%) | 99.94 | 100.0 | 99.86 | 99.92 | 99.57 | 99.76 |

TABLE AB

Fault Classification Results based on Second Dataset

| | Samples classified successfully | | | | | |
|---|---|---|---|---|---|---|
| | Noise free | | 40 dB SNR | | 20 dB SNR | |
| Fault type | DWT | ST | DWT | ST | DWT | ST |
| AG | 699 | 700 | 699 | 700 | 696 | 698 |
| BG | 698 | 700 | 697 | 699 | 695 | 698 |
| CG | 700 | 700 | 700 | 700 | 697 | 696 |
| ABG | 698 | 699 | 697 | 698 | 694 | 699 |
| BCG | 699 | 700 | 698 | 700 | 693 | 695 |
| CAG | 700 | 700 | 699 | 699 | 697 | 697 |
| ABCG | 699 | 700 | 698 | 699 | 697 | 698 |
| Overall Accuracy (%) | 99.857 | 99.98 | 99.755 | 99.898 | 99.367 | 99.612 |

TABLE III

Faulty Section Identification Results based on First Dataset

| | Samples classified successfully | | | | | |
|---|---|---|---|---|---|---|
| | Noise free | | 40 dB SNR | | 20 dB SNR | |
| Faulty Section | DWT | ST | DWT | ST | DWT | ST |
| $S_1$ | 900 | 900 | 900 | 900 | 873 | 899 |
| $S_2$ | 900 | 900 | 897 | 896 | 851 | 898 |
| $S_3$ | 899 | 900 | 898 | 900 | 879 | 893 |
| $S_4$ | 900 | 900 | 897 | 900 | 873 | 900 |
| $S_5$ | 900 | 900 | 900 | 898 | 891 | 887 |
| $S_6$ | 900 | 899 | 899 | 900 | 883 | 896 |
| $S_7$ | 899 | 900 | 900 | 899 | 885 | 897 |

TABLE III-continued

Faulty Section Identification Results based on First Dataset

| | Samples classified successfully | | | | | |
|---|---|---|---|---|---|---|
| | Noise free | | 40 dB SNR | | 20 dB SNR | |
| Faulty Section | DWT | ST | DWT | ST | DWT | ST |
| $S_8$ | 900 | 900 | 900 | 900 | 888 | 895 |
| $S_9$ | 900 | 899 | 894 | 896 | 887 | 884 |
| Accuracy (%) | 99.98 | 99.98 | 99.82 | 99.86 | 97.65 | 99.37 |

TABLE AC

Faulty Section Identification Results based on Second Dataset

| | Samples classified successfully | | | | | |
|---|---|---|---|---|---|---|
| | Noise free | | 40 dB SNR | | 20 dB SNR | |
| Faulty Section | DWT | ST | DWT | ST | DWT | ST |
| $S_1$ | 900 | 898 | 891 | 896 | 885 | 890 |
| $S_2$ | 899 | 895 | 889 | 897 | 858 | 865 |
| $S_3$ | 897 | 899 | 892 | 896 | 867 | 870 |
| $S_4$ | 896 | 896 | 898 | 898 | 865 | 881 |
| $S_5$ | 898 | 897 | 893 | 896 | 890 | 891 |
| $S_6$ | 893 | 899 | 893 | 897 | 870 | 878 |
| $S_7$ | 893 | 896 | 888 | 893 | 867 | 869 |
| $S_8$ | 895 | 884 | 895 | 886 | 889 | 886 |
| $S_9$ | 897 | 898 | 894 | 895 | 877 | 879 |
| Overall Accuracy (%) | 99.605 | 99.654 | 99.173 | 99.432 | 97.136 | 97.642 |

Similarly, the faulty section identification results of second dataset (see Table AC) confirmed the efficacy of the proposed signal processing based machine learning approach. As determined by Table AC, the ST based approach outperformed the DWT based approach.

D. Main Branch Fault Location Results

After detection, classification and section identification of the faults, the main branch faults were located as a regression problem. The total length of the main branch (650-632-671-680) of the test feeder is 5,000 feet whereas the laterals are short in length and identifying a section is enough to pinpoint the faults. The fault location methods and system of the present disclosure utilized the DWT and ST features extracted from the main feeder (node 650) and hydro-power plant (node 680) current signals a third dataset which is a subset of the second dataset. Several statistical performance indices were selected including the root mean squared error (RMSE), mean absolute percentage error (MAPE), RMSE-observations standard deviation ratio (RSR), coefficient of determination (R2), and Willmott's index of agreement (WIA) to validate the effectiveness of the fault location method and system. The lower values of first three (RMSE, MAPE, and RSR) and the values closer to unity for the last two (R2 and WIA) confirm the effectiveness of the regression model. The regression neural networks were trained and tested with 700 faulty cases and tested with 300 different cases for each type of fault and the faulty data were generated under the load demand, renewable energy generation, and fault information uncertainties.

TABLE IV

Statistical Performance Measures for the Test dataset in Noise-free Environment

| Fault Type | SPT | Statistical performance measures | | | | |
|---|---|---|---|---|---|---|
| | | RMSE | MAPE | RSR | $R^2$ | WIA |
| AG | DWT | 0.2476 | 5.9360 | 0.1821 | 0.9840 | 0.9917 |
| | ST | 0.1046 | 0.9952 | 0.0749 | 0.9972 | 0.9986 |
| BG | DWT | 0.2604 | 6.7484 | 0.1979 | 0.9814 | 0.9902 |
| | ST | 0.1084 | 1.1777 | 0.0782 | 0.9970 | 0.9985 |
| CG | DWT | 0.2460 | 6.0766 | 0.1761 | 0.9852 | 0.9922 |
| | ST | 0.0459 | 0.9343 | 0.0343 | 0.9994 | 0.9997 |
| ABG | DWT | 0.1999 | 3.5527 | 0.1431 | 0.9899 | 0.9949 |
| | ST | 0.0279 | 0.6035 | 0.0193 | 0.9998 | 0.9999 |
| BCG | DWT | 0.1597 | 4.2361 | 0.1163 | 0.9933 | 0.9966 |
| | ST | 0.0326 | 0.6612 | 0.0234 | 0.9997 | 0.9999 |
| CAG | DWT | 0.1278 | 3.2087 | 0.0922 | 0.9958 | 0.9979 |
| | ST | 0.0099 | 0.3212 | 0.0068 | 1.0000 | 1.0000 |
| ABCG | DWT | 0.1821 | 4.5756 | 0.1304 | 0.9916 | 0.9958 |
| | ST | 0.1839 | 0.8696 | 0.1276 | 0.9919 | 0.9959 |

TABLE V

Statistical Performance Measures for the Test dataset in the Presence of 40 dB SNR

| Fault Type | SPT | Statistical performance measures | | | | |
|---|---|---|---|---|---|---|
| | | RMSE | MAPE | RSR | $R^2$ | WIA |
| AG | DWT | 0.5065 | 16.228 | 0.3627 | 0.9391 | 0.9671 |
| | ST | 0.1039 | 3.1534 | 0.0777 | 0.9970 | 0.9985 |
| BG | DWT | 0.4975 | 14.744 | 0.3659 | 0.9406 | 0.9665 |
| | ST | 0.1296 | 2.3983 | 0.0938 | 0.9959 | 0.9978 |
| CG | DWT | 0.6052 | 18.865 | 0.4334 | 0.9248 | 0.9530 |
| | ST | 0.1654 | 2.9624 | 0.1236 | 0.9926 | 0.9962 |
| ABG | DWT | 0.3011 | 7.0871 | 0.2156 | 0.9771 | 0.9884 |
| | ST | 0.0341 | 0.8046 | 0.0247 | 0.9997 | 0.9998 |
| BCG | DWT | 0.2790 | 8.6978 | 0.2032 | 0.9817 | 0.9897 |
| | ST | 0.1447 | 1.2361 | 0.1047 | 0.9945 | 0.9973 |
| CAG | DWT | 0.3427 | 10.769 | 0.2454 | 0.9713 | 0.9850 |
| | ST | 0.0508 | 0.8872 | 0.0366 | 0.9993 | 0.9997 |
| ABCG | DWT | 0.1978 | 6.0200 | 0.1395 | 0.9904 | 0.9951 |
| | ST | 0.0745 | 0.7138 | 0.0557 | 0.9985 | 0.9992 |

Table IV presents the selected statistical performance indices of the test dataset for a noise-free measurement. The RMSE, MAPE, and RSR values are low whereas the $R^2$ and WIA values are close to unity, which illustrates the effectiveness of both DWT and ST based approaches in locating different types of faults on the main branch. However, the statistical performance indices using the DWT approach are not promising and may provide misleading information about the fault location in the presence of measurement noise (Table V).

Conversely, the ST based approach continued to prove its effectiveness even in the presence of measurement noise (Table V and Table VI). Consequently, the ST based approach has higher accuracy than the DWT based approach in diagnosing faults.

TABLE VI

Statistical Performance Measures for the Test dataset
in the Presence of 20 dB SNR (ST approach)

| Fault Type | Statistical performance measures | | | | |
|---|---|---|---|---|---|
| | RMSE | MAPE | RSR | $R^2$ | WIA |
| AG | 0.1577 | 4.7183 | 0.1179 | 0.9931 | 0.9965 |
| BG | 0.2965 | 7.0936 | 0.2208 | 0.9769 | 0.9878 |
| CG | 0.2049 | 9.3568 | 0.1526 | 0.9883 | 0.9942 |
| ABG | 0.1756 | 6.0718 | 0.1270 | 0.9919 | 0.9960 |
| BCG | 0.1876 | 6.1606 | 0.1397 | 0.9902 | 0.9951 |
| CAG | 0.2703 | 5.7115 | 0.1956 | 0.9813 | 0.9904 |
| ABCG | 0.2711 | 4.1546 | 0.2019 | 0.9813 | 0.9898 |

E. Validation of the IFD Technique Under Base Loading and Renewable Energy Generation Conditions The effectiveness of the IFD method and system under base loading and renewable energy generation condition was verified. Table VII details the fault diagnosis results from the case of base loading and renewable energy generation condition with fault resistance and inception angle uncertainties. The location and type of the faults were arbitrarily selected where the data was recorded in RSCAD environment. As can be observed, both DWT and ST based techniques detected and classified the faults successfully. Additionally, the faulty sections were identified and the faults were successfully located (if detected on the main branch), which validates the effectiveness of the IFD method and system to diagnose faults in a distribution grid with less than 1% error. For validation, the present disclosure employed trained multi-layer perceptron neural networks based on first dataset for fault detection, classification, and faulty section identification purposes. In addition, trained neural networks based on third dataset for fault location purpose were also employed.

TABLE VII

Fault Diagnosis Results under Base Loading
and Renewable Energy Generation Condition

| Fault Number | Item | Applied Fault Information | Estimated Results DWT-based MLT | Estimated Results ST-based MLT |
|---|---|---|---|---|
| 1 | Node | 611 | — | — |
| | Type | CG | CG | CG |
| | Section | 1 | 1 | 1 |
| | Main Branch | No | No | No |
| 2 | Node | 632a | — | — |
| | Type | BCG | BCG | BCG |
| | Section | 7 | 7 | 7 |
| | Main Branch | Yes | Yes | Yes |
| | Location (ft.) | 2500 | 2500.34 | 2513.22 |
| | Error (%) | — | 0.0068 | 0.2643 |
| 3 | Node | 680 | — | — |
| | Type | CAG | CAG | CAG |
| | Section | 3 | 3 | 3 |
| | Main Branch | Yes | Yes | Yes |
| | Location (ft.) | 5000 | 4999.94 | 4999.10 |
| | Error (%) | — | 0.0012 | 0.0179 |

F. Validation of the IFD Technique Under Load Demand Uncertainties Only

The IFD method and system was further tested under load demand uncertainties by considering a fixed output of the renewable energy resources. Table VIII presents the IFD method and system estimated results for ±20% load demand uncertainties. As can be observed, both DWT and ST based approaches diagnosed the faults accurately and ST based approach outperformed the DWT based approach.

TABLE VIII

Fault Diagnosis Results under ±20% Load Demand Uncertainties

| Fault Number | Item | Applied Fault Information | Estimated Results DWT-based MLT | Estimated Results ST-based MLT |
|---|---|---|---|---|
| 1 | Node | 632b | — | — |
| | Type | ABG | ABG | ABG |
| | Section | 7 | 7 | 7 |
| | Main Branch | Yes | Yes | Yes |
| | Location (ft.) | 3000 | 3158.27 | 3001.73 |
| | Error (%) | — | 3.17 | 0.0346 |
| 2 | Node | 652 | — | — |
| | Type | AG | AG | AG |
| | Section | 2 | 2 | 2 |
| | Main Branch | No | No | No |

G. Validation of the IFD Technique Under Both Load Demand and Renewable Energy Generation Uncertainties Table IX shows the fault diagnosis results of the IFD technique under both load demand and renewable energy generation uncertainties. The results again validate the effectiveness of the technique and confirm the superiority of the ST based approach over the DWT based approach.

TABLE IX

Fault Diagnosis Results under ±15% Renewable Energy
Generation and ±15% Load Demand Uncertainties

| Fault Number | Item | Applied Fault Information | Estimated Results DWT-based MLT | Estimated Results ST-based MLT |
|---|---|---|---|---|
| 1 | Node | 650b | — | — |
| | Type | CAG | CAG | CAG |
| | Section | 8 | 8 | 8 |
| | Main Branch | Yes | Yes | Yes |
| | Location (ft.) | 1000 | 837.28 | 1084.82 |
| | Error (%) | — | 3.25 | 1.70 |
| 2 | Node | 692 | — | — |
| | Type | ABG | ABG | ABG |
| | Section | 4 | 4 | 4 |
| | Main Branch | No | No | No |

H. Validation of the IFD Technique Under Contingencies

Fault diagnosis results under various contingencies such as ±15% load demand and ±10% renewable energy generation uncertainties are described below. Table X, Table XI and Table XII summarize the fault diagnosis results under a single branch outage (633-634), wind power plant 633 outage, and PV power plant 645 outage. The IFD method and system diagnosed the applied faults successfully except the second fault of Table XI, where the DWT based approach identified an incorrect section as the faulty section. As can be observed from the results of the contingency cases, the ST approach again outperformed the DWT approach in terms of overall accuracy.

TABLE X

Fault Diagnosis Results under Branch Outage (633-634)

| Contingency | Item | Applied Fault Information | Estimated Results DWT-based MLT | Estimated Results ST-based MLT |
|---|---|---|---|---|
| 1 | Node | 645 | — | — |
|  | Type | BG | BG | BG |
|  | Section | 5 | 5 | 5 |
|  | Main Branch | No | No | No |
| 2 | Node | 650c | — | — |
|  | Type | ABCG | ABCG | ABCG |
|  | Section | 8 | 8 | 8 |
|  | Main Branch | Yes | Yes | Yes |
|  | Location (ft.) | 1500 | 1755.48 | 1596.83 |
|  | Error (%) | — | 5.11 | 1.93 |

TABLE XI

Fault Diagnosis Results under Wind Power Plant Outage

| Fault Number | Item | Applied Fault Information | Estimated Results DWT-based MLT | Estimated Results ST-based MLT |
|---|---|---|---|---|
| 1 | Node | 611 | — | — |
|  | Type | CG | CG | CG |
|  | Section | 1 | 1 | 1 |
|  | Main Branch | No | No | No |
| 2 | Node | 675 | — | — |
|  | Type | ABCG | ABCG | ABCG |
|  | Section | 4 | 6 (incorrect) | 4 |
|  | Main Branch | No | No | No |

TABLE XII

Fault Diagnosis Results under PV Power Plant Outage

| Fault Number | Item | Applied Fault Information | Estimated Results DWT-based MLT | Estimated Results ST-based MLT |
|---|---|---|---|---|
| 1 | Node | 650b | — | — |
|  | Type | CAG | CAG | CAG |
|  | Section | 8 | 8 | 8 |
|  | Main Branch | Yes | Yes | Yes |
|  | Location (ft.) | 1000 | 837.2781 | 1084.8194 |
|  | Error (%) | — | 3.25 | 1.70 |
| 2 | Node | 692 | — | — |
|  | Type | ABG | ABG | ABG |
|  | Section | 4 | 4 | 4 |
|  | Main Branch | No | No | No |

I. Experimental Validation of the IFD Technique

As shown above, the IFD method and system using RSCAD recorded data was examined and it was found that the ST based approach performed better than the DWT based approach. Experimental validation of the ST based IFD method and system is now addressed. Several faults were applied on the test distribution feeder which incorporate load demand (±15%), renewable energy generation (±10%), and fault information uncertainties. Next, faulty current signals were recorded employing a physical phasor measurement unit (PMU). In non-limiting examples, a physical phasor measurement unit manufactured by National Instruments in the LabVIEW platform through the Giga-Transceiver Analogue Output Card (GTAO) card of the RTDS machine may be used. The GTAO provides optically isolated analogue output from a simulation to external equipment. (See Phasor Measurement (Std 2011) VI, Part Number: 373375G-0, National Instruments, 11500 N Mopac Expwy, Austin, Tex. 78759-3504, http://zone.ni.com/reference/en-XX/help/373375G-01/lvept/2011_pmu_phasor/; GTAO—Giga-Transceiver Analogue Output Card, RTDS Technologies Inc., 100-150 Innovation Drive, Winnipeg, MB R3T 2E1 Canada, https://www.rtds.com/wp-content/uploads/2014/09/GTIO-Cards.pdf, each incorporated herein by reference in their entirety)

A phasor measurement unit (PMU) is a device used to estimate the magnitude and phase angle of an electrical phasor quantity, such as voltage or current in the electricity grid, using a common time source for synchronization. Time synchronization is usually provided by GPS and allows synchronized real-time measurements of multiple remote measurement points on the grid. PMUs are capable of capturing samples from a waveform in quick succession and reconstruct the Phasor quantity. Dynamic events in the grid can be analyzed using a PMU, which are not possible to determine with traditional SCADA measurements.

However, the current signals of the main feeder and three renewable energy resources were recorded due to the channel limitations of the PMU. These same signals were recorded in the RSCAD environment. Useful features were extracted from both physical PMU and RSCAD recorded data employing the ST. These features were fetched to the trained and tested MLP neural networks to obtain a decision on the applied faults.

Figure 5:
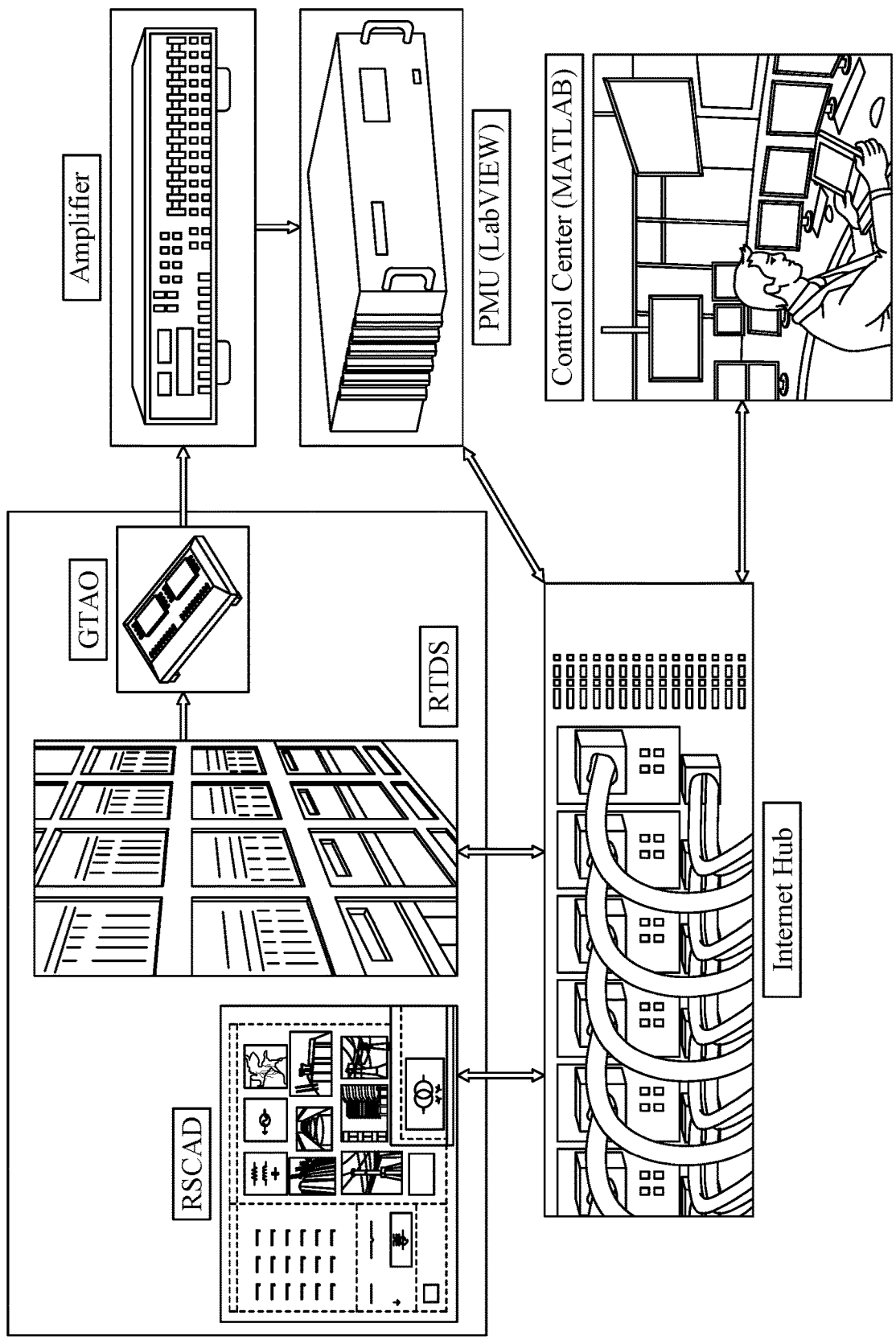
FIG. 5 illustrates a schematic diagram of the laboratory prototype IFD apparatus for a distribution grid.

FIG. 5 presents the experimental set up of the IFD method and system for using the test distribution feeder. As can be seen from Table XIII, the IFD method and system detected and classified the applied faults accurately for both types of recorded data. In addition, the IFD method and system also identified each faulty section effectively and located the main branch faults with satisfactory accuracy. Therefore, it can be concluded that the estimated fault diagnosis results were validated by the laboratory IFD prototype.

TABLE XIII

Fault Diagnosis Results of the Developed Laboratory prototype IFD Scheme

| Fault Number | Item | Applied Fault Information | Estimated Results RSCAD Data | Estimated Results Physical PMU Data |
|---|---|---|---|---|
| 1 | Node | 632c | — | — |
|  | Type | CAG | CAG | CAG |
|  | Section | 7 | 7 | 7 |
|  | Main Branch | Yes | Yes | Yes |
|  | Location (ft.) | 3500 | 3514.26 | 3696.39 |
|  | Error (%) | — | 0.2852 | 3.93 |
| 2 | Node | 633 | — | — |
|  | Type | ABG | ABG | ABG |
|  | Section | 6 | 6 | 6 |
|  | Main Branch | No | No | No |
| 3 | Node | 680 | — | — |
|  | Type | BCG | BCG | BCG |
|  | Section | 3 | 3 | 3 |
|  | Main Branch | Yes | Yes | Yes |
|  | Location (ft.) | 5000 | 4999.99 | 5000 |
|  | Error (%) | — | 0.00008 | 0 |
| 4 | Node | 684 | — | — |
|  | Type | CG | CG | CG |
|  | Section | 9 | 9 | 9 |
|  | Main Branch | No | No | No |
| 5 | Node | 692 | — | — |
|  | Type | CAG | CAG | CAG |
|  | Section | 4 | 4 | 4 |
|  | Main Branch | No | No | No |

An IFD method and system combining the advanced signal processing techniques and machine learning tools was described and implemented on an IEEE standard test distribution grid. The test grid was modeled by incorporating load demand and renewable energy generation uncertainties employing a variety of probability density functions. The sensitivity of the IFD method and system was tested in the presence of measurement noise, fault resistance and inception angle uncertainties. An IFD prototype combining RSCAD software, RTDS machine, physical PMU, LabVIEW and MATLAB platforms is described. The results confirmed the robustness, scalability, effectiveness, and accuracy of the IFD method and system of the present disclosure, exhibiting good agreement with the simulation results.

The IFD method and system of the present disclosure lends itself to the development of a simultaneous fault diagnosis method and system for distribution grids. Furthermore, the IFD method and system may also be applied to different sources of waveform distortion, including low sampling frequency, low-resolution measuring devices, and transformer saturation.

Figure 6:
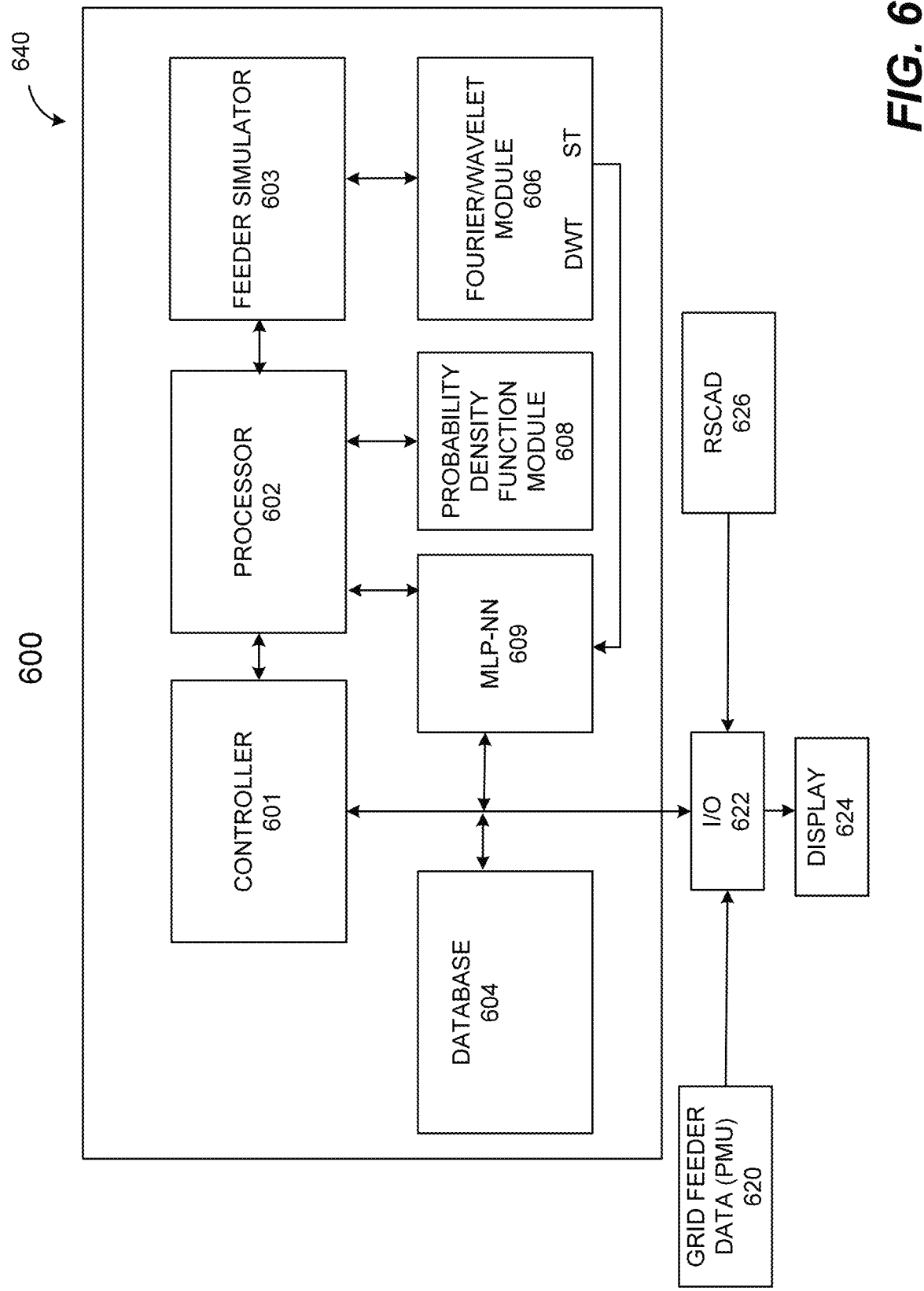
FIG. 6 illustrates a computing system for performing the IFD method and system.

FIG. 6 describes a computing system for implementing the fault diagnosis method and system of the present disclosure. A controller 601 receives RSCAD data 626 and grid feeder data from a PMU 620 through I/O port 622. The controller stores the RSCAD and PMU data in database 604. The controller 601 is connected to processor 602, which sends the RSCAD data to feeder simulator module 603, and probability density function module 608. Further, the PMU physical measurements are compared to the feeder simulation using the RSCAD data in Fourier/wavelet module 606, where either a DWT or Stockwell transform is applied to determine whether or not the output should be sent to the MLP-NN module 609. The MLP-NN output is returned to the controller 601 for output of fault types and fault locations on the display 624.

Figure 7:
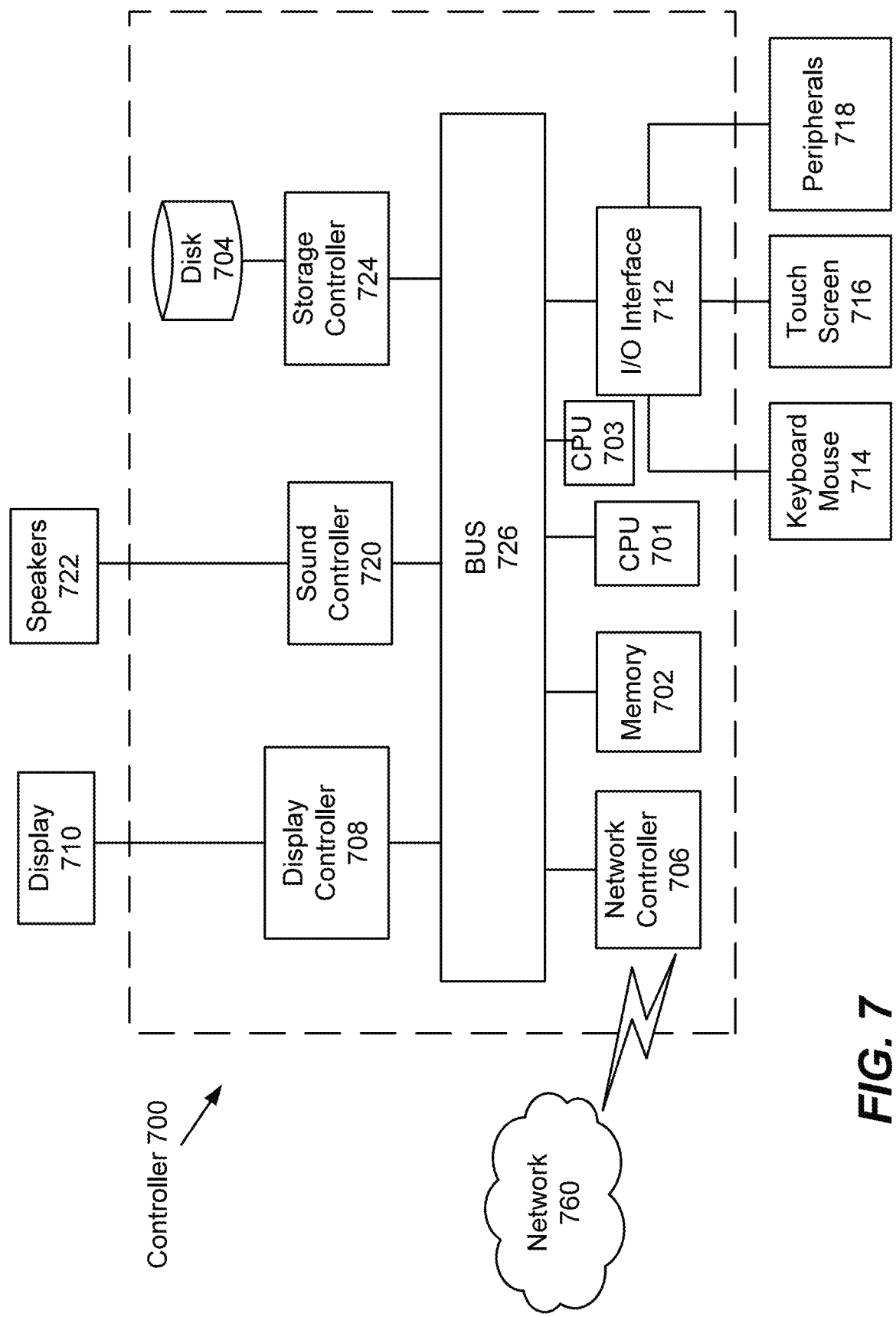
FIG. 7 is an illustration of a non-limiting example of details of computing hardware used in the computing system, according to certain embodiments.

Next, further details of the hardware description of the computing environment of FIG. 6 according to exemplary embodiments are described with reference to FIG. 7. In FIG. 7, a controller 700 is described is representative of an IFD system 600 of FIG. 6 in which the controller is a computing device which includes a CPU 701 which performs the processes described above/below. The process data and instructions may be stored in memory 702. These processes and instructions may also be stored on a storage medium disk 704 such as a hard drive (HDD) or portable storage medium or may be stored remotely.

Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claimed advancements may be provided as a utility application, background daemon, or component of an operating system, or combination thereof, executing in conjunction with CPU 701, 703 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 701 or CPU 703 may be a Xenon or Core processor from Intel of America or an Opteron processor from AMD of America, or may be other processor types that would be recognized by one of ordinary skill in the art. Alternatively, the CPU 701, 703 may be implemented on an FPGA, ASIC, PLD or using discrete logic circuits, as one of ordinary skill in the art would recognize. Further, CPU 701, 703 may be implemented as multiple processors cooperatively working in parallel to perform the instructions of the inventive processes described above.

The computing device in FIG. 7 also includes a network controller 706, such as an Intel Ethernet PRO network interface card from Intel Corporation of America, for interfacing with network 760. As can be appreciated, the network 760 can be a public network, such as the Internet, or a private network such as an LAN or WAN network, or any combination thereof and can also include PSTN or ISDN subnetworks. The network 760 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 708, such as a NVIDIA GeForce GTX or Quadro graphics adaptor from NVIDIA Corporation of America for interfacing with display 710, such as a Hewlett Packard HPL2445w LCD monitor. A general purpose I/O interface 712 interfaces with a keyboard and/or mouse 714 as well as a touch screen panel 716 on or separate from display 710. General purpose I/O interface also connects to a variety of peripherals 718 including printers and scanners, such as an OfficeJet or DeskJet from Hewlett Packard.

A sound controller 720 is also provided in the computing device such as Sound Blaster X-Fi Titanium from Creative, to interface with speakers/microphone 722 thereby providing sounds and/or music.

The general purpose storage controller 724 connects the storage medium disk 704 with communication bus 726, which may be an ISA, EISA, VESA, PCI, or similar, for interconnecting all of the components of the computing device. A description of the general features and functionality of the display 710, keyboard and/or mouse 714, as well as the display controller 708, storage controller 724, network controller 706, sound controller 720, and general purpose I/O interface 712 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 8.

Figure 8:
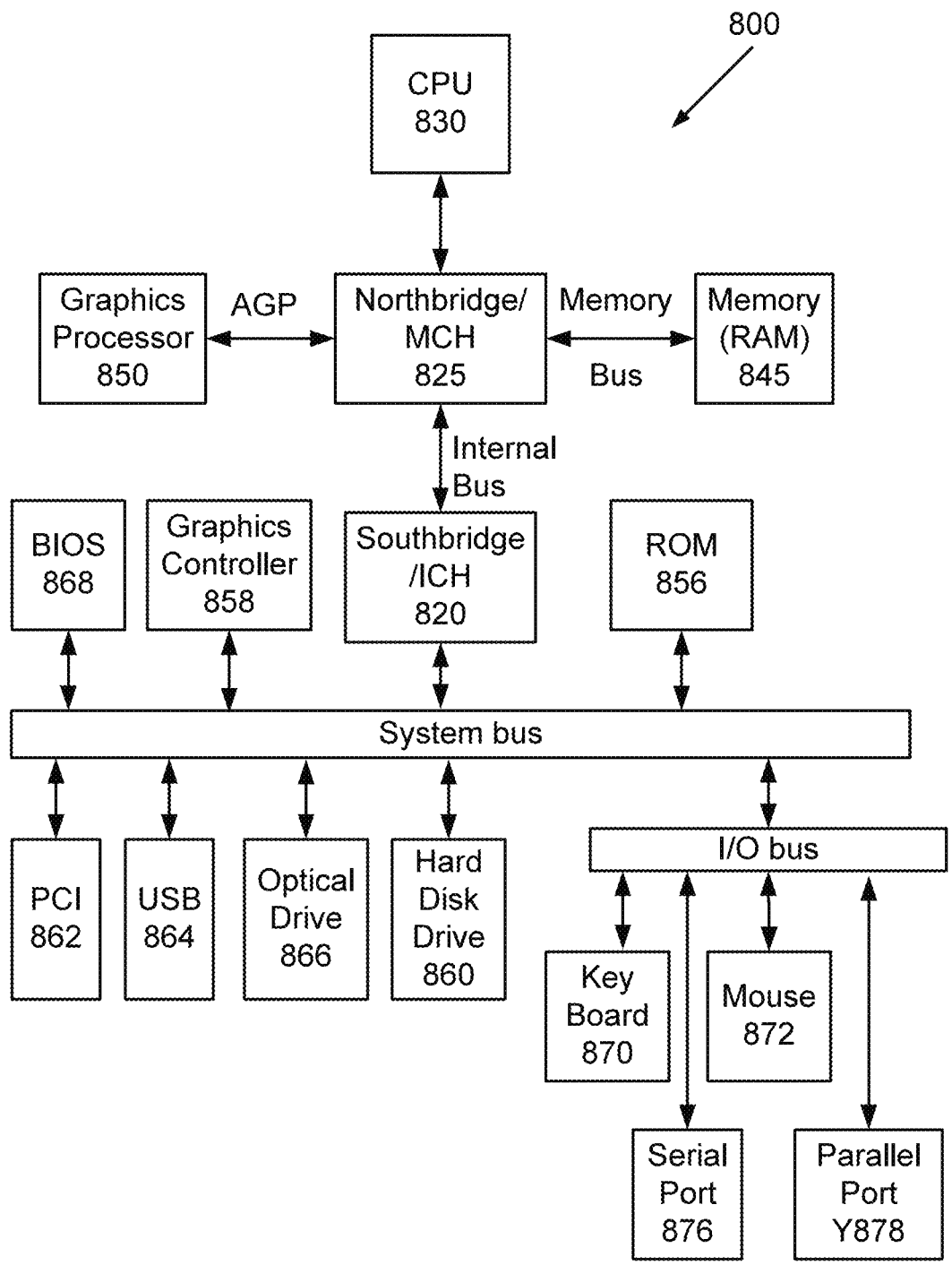
FIG. 8 is an exemplary schematic diagram of a data processing system used within the computing system, according to certain embodiments.

FIG. 8 shows a schematic diagram of a data processing system, according to certain embodiments, for performing the functions of the exemplary embodiments. The data processing system is an example of a computer in which code or instructions implementing the processes of the illustrative embodiments may be located.

In FIG. 8, data processing system 800 employs a hub architecture including a north bridge and memory controller hub (NB/MCH) 825 and a south bridge and input/output (I/O) controller hub (SB/ICH) 820. The central processing unit (CPU) 830 is connected to NB/MCH 825. The NB/MCH 825 also connects to the memory 845 via a memory bus, and connects to the graphics processor 850 via an accelerated graphics port (AGP). The NB/MCH 825 also connects to the SB/ICH 820 via an internal bus (e.g., a unified media interface or a direct media interface). The CPU Processing unit 830 may contain one or more processors and even may be implemented using one or more heterogeneous processor systems.

Figure 9:
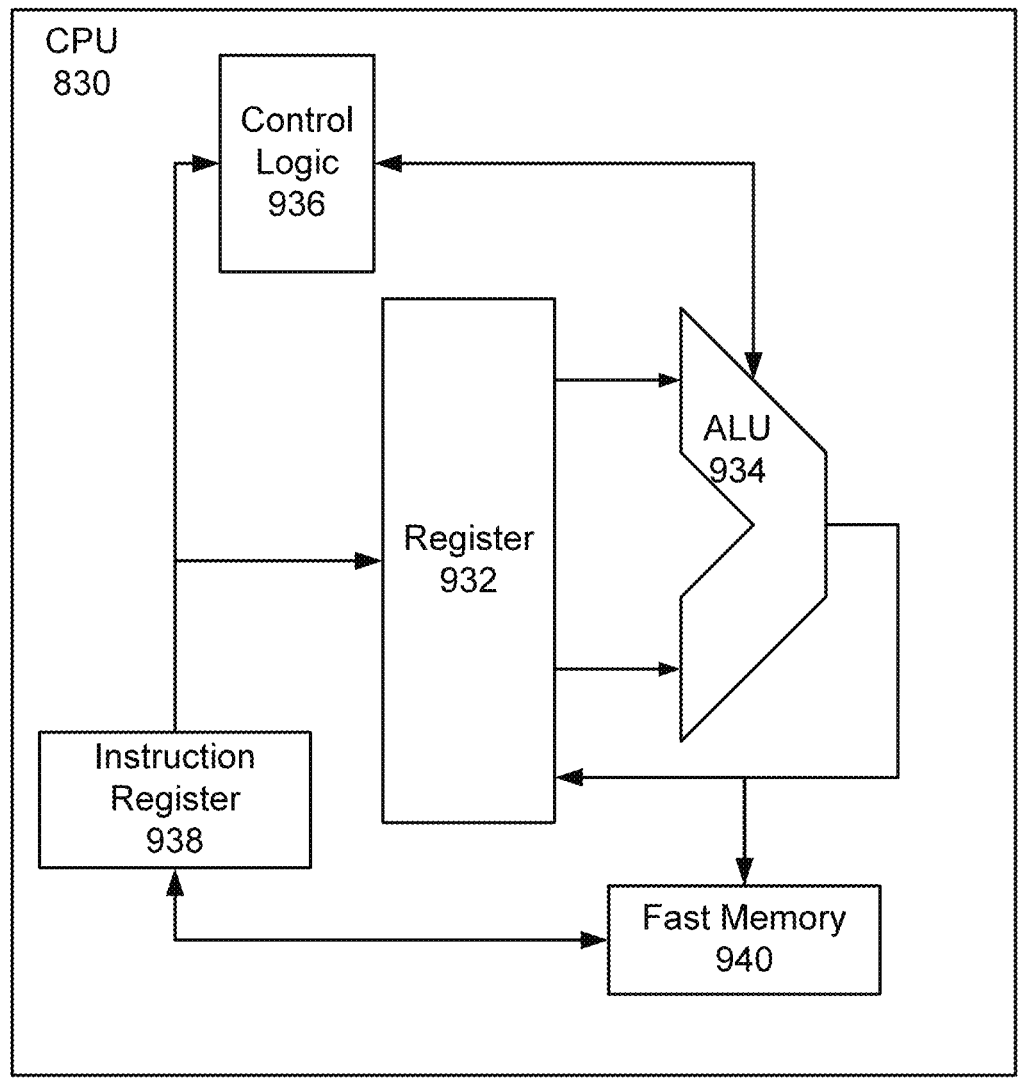
FIG. 9 is an exemplary schematic diagram of a processor used with the computing system, according to certain embodiments.

For example, FIG. 9 shows one implementation of CPU 830. In one implementation, the instruction register 938 retrieves instructions from the fast memory 940. At least part of these instructions are fetched from the instruction register 938 by the control logic 936 and interpreted according to the instruction set architecture of the CPU 830. Part of the instructions can also be directed to the register 932. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 934 that loads values from the register 932 and performs logical and mathematical operations on the loaded values according to the instructions. The results from these operations can be feedback into the register and/or stored in the fast memory 940. According to certain implementations, the instruction set architecture of the CPU 830 can use a reduced instruction set architecture, a complex instruction set architecture, a vector processor architecture, a very large instruction word architecture. Furthermore, the CPU 830 can be based on the Von Neuman model or the Harvard model. The CPU 830 can be a digital signal processor, an FPGA, an ASIC, a PLA, a PLD, or a CPLD. Further, the CPU 830 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 8, the data processing system 800 can include that the SB/ICH 820 is coupled through a system bus to an I/O Bus, a read only memory (ROM) 856, universal serial bus (USB) port 864, a flash binary input/output system (BIOS) 868, and a graphics controller 858. PCI/PCIe devices can also be coupled to SB/ICH 888 through a PCI bus 862.

The PCI devices may include, for example, Ethernet adapters, add-in cards, and PC cards for notebook computers. The Hard disk drive 860 and CD-ROM 866 can use, for example, an integrated drive electronics (IDE) or serial advanced technology attachment (SATA) interface. In one implementation the I/O bus can include a super I/O (SIO) device.

Further, the hard disk drive (HDD) 860 and optical drive 866 can also be coupled to the SB/ICH 820 through a system bus. In one implementation, a keyboard 870, a mouse 872, a parallel port 878, and a serial port 876 can be connected to the system bus through the I/O bus. Other peripherals and devices that can be connected to the SB/ICH 820 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 10:
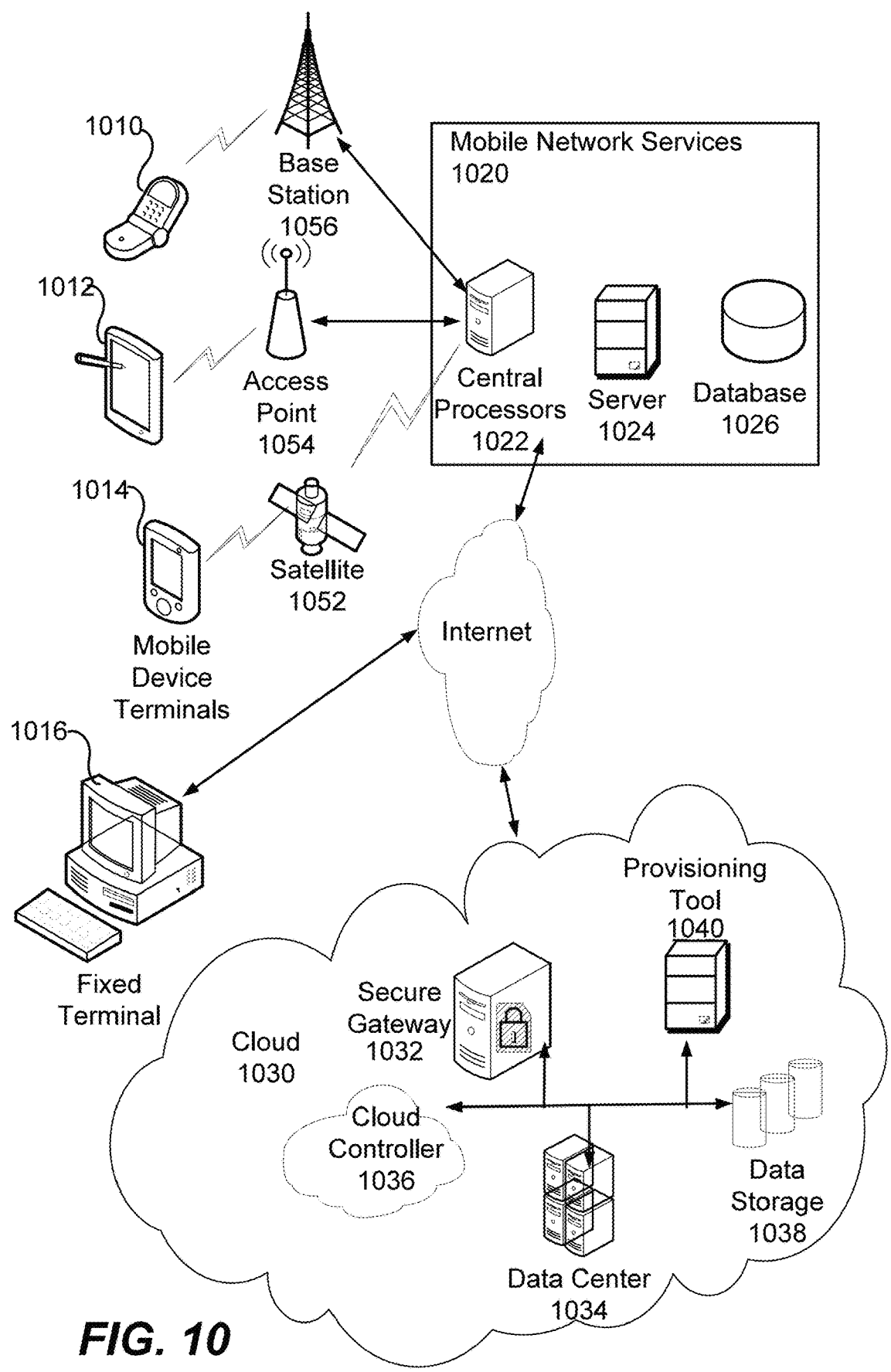
FIG. 10 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 10, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for intelligent fault diagnosis of a distribution feeder connected to renewable energy resources, comprising:
    modelling, with a computing system having circuitry configured for modelling and processing, the distribution feeder, the distribution feeder having predetermined electrical characteristics, wherein the distribution feeder is divided into branches separated by nodes, wherein each node is connected to at least one of a power input or a power output, wherein at least one power input is a renewable energy resource and at least one power input is a main feeder;
    modelling uncertainties in the energy supply of at least one renewable energy resource connected to a power input node by a first probability density function of a load demand of at least one power output node and by a second probability density function of the uncertainties in the energy supply of the at least one renewable energy resource;
    generating, from the modelling, a first dataset of three phase current signals of a plurality of branches of the distribution grid;
    generating, from the modelling, a second dataset of three phase current signals of the main feeder and at least one renewable energy resource;
    analyzing the first dataset and the second dataset to extract features of each branch;
    recording the three phase current signals at each power output node;
    determining whether a branch has a fault by comparing the three phase current signals at each power output node to the extracted features of each branch;
    locating and classifying the fault; and
    displaying the extracted features of the fault and a fault location.

2. The method of claim 1, further comprising:
    wherein the renewable energy resource is at least one of a wind energy source, a solar energy source, a hydroelectric power source, a geothermal energy source and a wave energy source.

3. The method of claim 1, wherein analyzing the first and second datasets further comprises inputting the first and second datasets to a short-time Fourier transform combined with a second signal processing transform, wherein the second signal processing transform is one of a discrete wavelet transform (DWT) and a Stockwell transform (ST).

4. The method of claim 1, further comprising recording the three phase current signals with a physical phasor measurement unit (PMU).

5. The method of claim 1, further comprising locating and classifying faults by:
inputting the extracted features to a multilayer perceptron neural network (MLP-NN);
comparing each set of current signals at each node to the extracted features; and
outputting a class and location of each fault from the multilayer perceptron neural network.

6. The method of claim 5, wherein the multilayer perceptron neural network further comprises an activation function for comparing each set of current signals at each node to the extracted features and generating an output.

7. The method of claim 6, wherein the activation function is a continuous tan-sigmoid function given by the equation:

$$\sigma(x) = \tanh(x) = \frac{ex\overline{e} - x}{ex + e - x}.$$

8. The method of claim 5, wherein outputting the class of each fault comprises comparing the signal to noise ratio of the current values of each node to extracted features of each section.

9. The method of claim 1,
wherein recording the three phase current signals includes measuring frequencies and phasors at each of the power output nodes.

10. The method of claim 1, wherein modelling uncertainties in the load demand comprises inputting the electrical characteristics to the first probability density function given by $$f(x_L \mid \mu_L, \sigma_L) = \frac{1}{\sigma_L\sqrt{2\pi}} e^{-\frac{(x_L - \mu_L)^2}{2\sigma_L^2}}; \ -\infty < x_L < \infty, \mu_L < \infty, \sigma_L > 0$$

where $x_L$ is a variable indicating the location of a node under consideration, $\mu_L$ is the rated active load, $\sigma_L$ is the standard deviation.

11. The method of claim 1, wherein modelling uncertainties in the energy supply of the at least one renewable energy resource comprises inputting the electrical characteristics to the second probability density function given by $$f(x \mid \alpha, \beta, \gamma) = \frac{\beta}{\alpha}\left(\frac{x-\gamma}{\alpha}\right)^{\beta-1} e^{-\left(\frac{x-\gamma}{\alpha}\right)^{\beta}}; x \geq \gamma, \alpha, \beta > 0$$

where x is a variable indicating the location of a node under consideration, α is the scale parameter of a distribution of the probability density function, β is the shape parameter related to the slope of the distribution of the probability density function and γ is the lower boundary of the variable x.

12. The method of claim 2, wherein modelling uncertainties in a wind speed of the wind energy source comprises inputting the electrical characteristics to the second probability density function given by $$f(x_w \mid \alpha_w, \beta_w) = \frac{\beta_w}{\alpha_w}\left(\frac{x_w}{\alpha_w}\right)^{\beta_w - 1} e^{-\left(\frac{x_w}{\alpha_w}\right)^{\beta_w}} \ \text{for } x_w \geq 0; \alpha_w, \beta_w > 0$$

where $x_w$ is a variable indicating the location of a node under consideration, $\alpha_w$ is the scale parameter of a distribution of the probability density function, $\beta_w$ is the shape parameter related to the slope of the distribution of the probability density function.

13. The method of claim 12, further comprising calculating the power output of the wind energy source by:

$$P_w(v) = \begin{cases} 0 & 0 \leq v \leq v_{ci} \text{ or } v_{co} \leq v \\ P_{wrated} \times \frac{v - v_{ci}}{v_r - v_{ci}} & v_{ci} \leq v \leq v_r \\ P_{wrated} & v_{co} \leq v \end{cases}$$

where v is a predicted wind speed, $v_r$ is a rated wind speed, $v_{ci}$ is a cut-in wind speed and $v_{co}$ is a cut-off wind speed.

14. The method of claim 2, wherein modelling uncertainties in solar irradiation of the solar energy source comprises inputting the electrical characteristics to the second probability density function given by $$f(x_s \mid \alpha_s, \beta_s) = \frac{\beta_s}{\alpha_s}\left(\frac{x_s}{\alpha_s}\right)^{\beta_s - 1} e^{-\left(\frac{x_s}{\alpha_s}\right)^{\beta_s}} \ \text{for } x_s \geq 0; \alpha_s, \beta_s > 0$$

where $x_s$ is a variable indicating the location of a node under consideration, $\alpha_s$ is the scale parameter of a distribution of the probability density function, $\beta_s$ is the shape parameter related to the slope of the distribution of the probability density function.

15. The method of claim 14, further comprising calculating the power output of the solar energy source by:

$$P_s(s) = \begin{cases} P_{srated} \times \frac{G}{G_r} & 0 \leq G \leq G_r \\ P_{srated} & G_r \leq G \end{cases}$$

where G and $G_r$ are predicted and rated solar irradiations, respectively.

16. The method of claim 2, further comprising calculating a fault resistance, R, by:
R~U($R_{min}$, $R_{max}$), where U is a uniform probability density function, $R_{min}$=0Ω, $R_{max}$=50Ω.

17. A non-transitory computer readable medium having instructions stored therein that, when executed by one or more processors, causes the one or more processors to perform a method for intelligent fault diagnosis of a distribution feeder connected to renewable energy resources, comprising:
modelling, with a computing system having circuitry configured for modelling and processing, the distribution feeder, the distribution feeder having predetermined electrical characteristics, wherein the distribution feeder is divided into branches separated by nodes, wherein each node is connected to at least one of a power input or a power output, wherein at least one power input is a renewable energy resource and at least one power input is a main feeder;

modelling uncertainties in the energy supply of at least one renewable energy resource connected to a power input node by a first probability density function describing a load demand of at least one power output node and a second probability density function modelling uncertainties in the energy supply of the at least one renewable energy resource;

generating, from the modelling, a first dataset of three phase current signals for a plurality of pre-specified branches of the distribution grid;

generating, from the modelling, a second dataset of three phase current signals of the main feeder and at least one renewable energy resource;

analyzing the first dataset and the second dataset to extract features of each branch;

recording the three phase current signals at each power output node;

determining whether a branch has a fault by comparing the three phase current signals at each power output node to the extracted features of each branch;

locating and classifying the fault; and displaying, by a display, the extracted features of the fault and a fault location.

18. The non-transitory computer readable medium method of claim 17, wherein analyzing the first and second datasets further comprises inputting the first and second datasets to a short-time Fourier transform combined with a wavelet transform.

19. The non-transitory computer readable medium method of claim 17, further comprising recording the three phase current signals with a physical phasor measurement unit (PMU).

20. The non-transitory computer readable medium method of claim 19, further comprising locating and classifying faults by:

inputting the extracted features to a multilayer perceptron neural network (MLP-NN);

comparing each set of three phase current signals at each node to the extracted features; and outputting a class and the location of each fault from the multilayer perceptron neural network.

* * * * *